United States Patent
Garner et al.

(10) Patent No.: US 10,424,606 B1
(45) Date of Patent: Sep. 24, 2019

(54) SYSTEMS AND METHODS FOR REDUCING SUBSTRATE SURFACE DISRUPTION DURING VIA FORMATION

(71) Applicant: CORNING INCORPORATED, Corning, NY (US)

(72) Inventors: Sean Matthew Garner, Elmira, NY (US); Daniel Wayne Levesque, Jr., Avoca, NY (US); Robert George Manley, Vestal, NY (US); Garrett Andrew Piech, Corning, NY (US); Rajesh Vaddi, Corning, NY (US); Heather Nicole Vanselous, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/972,628

(22) Filed: May 7, 2018

Related U.S. Application Data

(60) Provisional application No. 62/653,158, filed on Apr. 5, 2018.

(51) Int. Cl.
 *H01L 27/12* (2006.01)
 *H01L 27/15* (2006.01)

(52) U.S. Cl.
 CPC ...... *H01L 27/1262* (2013.01); *H01L 27/1218* (2013.01); *H01L 27/156* (2013.01)

(58) Field of Classification Search
 CPC ............. H01L 27/1262; H01L 27/1218; H01L 27/156
 See application file for complete search history.

(56) References Cited

U.S. PATENT DOCUMENTS

| | | |
|---|---|---|
| 2011/0129999 A1 | 6/2011 | Nukaga et al. |
| 2014/0166395 A2 | 6/2014 | Tracy |
| 2015/0049498 A1 | 2/2015 | Zhou |
| 2015/0060402 A1 | 3/2015 | Burkett et al. |
| 2015/0140241 A1* | 5/2015 | Hosseini ............ B23K 26/0617 428/34.4 |
| 2015/0140721 A1 | 5/2015 | Moslehi et al. |
| 2015/0155445 A1 | 6/2015 | Zhan et al. |
| 2015/0166396 A1 | 6/2015 | Marjanovic et al. |
| 2015/0210074 A1 | 7/2015 | Chen et al. |
| 2015/0214430 A1 | 7/2015 | Zhan et al. |
| 2016/0159679 A1* | 6/2016 | West ...................... B23K 26/38 65/112 |
| 2016/0368100 A1 | 12/2016 | Marjanovic et al. |
| 2017/0008122 A1 | 1/2017 | Wieland et al. |
| 2017/0047997 A1 | 2/2017 | Chen et al. |
| 2017/0358447 A1* | 12/2017 | Tsunetomo ............ C03C 15/00 |
| 2018/0062342 A1 | 3/2018 | Comstock, II et al. |

(Continued)

OTHER PUBLICATIONS

Brusberg et al; "Thin Glass Based Packaging Technologies for Optoelectronic Modules"; IEEE, 2009 Electronic Components and Technology Conference; pp. 207-212.

(Continued)

*Primary Examiner* — Kyoung Lee
(74) *Attorney, Agent, or Firm* — Ryan T. Hardee

(57) ABSTRACT

Embodiments are related to systems and methods for forming vias in a substrate, and more particularly to systems and methods for reducing substrate surface disruption during via formation.

55 Claims, 17 Drawing Sheets

(56) References Cited

U.S. PATENT DOCUMENTS

2018/0068868 A1 3/2018 Jaramillo et al.
2018/0130705 A1 5/2018 Huang et al.

OTHER PUBLICATIONS

Khare et al; "Via Hole Formation in Semi-Insulating InP Using Wet Photoelectrochemical Etching"; Indium Phoshide and Related Materials, 1993, Conference Proceedings.
Manley et al; Through Glass via Fabrication Using a Protective Material; Filed as U.S. Appl. No. 62/578,109, filed Oct. 27, 2017; 17 Pages.

* cited by examiner

Example Through Hole Vias Formed After Formation of Thin-Film-Transistors

SYSTEMS AND METHODS FOR REDUCING
SUBSTRATE SURFACE DISRUPTION
DURING VIA FORMATION

CROSS REFERENCE TO RELATED
APPLICATION

The present application claims priority to (i.e., is a non-provisional of) U.S. Pat. App. No. 62/653,158 entitled "Integrated Arrays for MicroLED Displays", and filed Apr. 5, 2018 by Garner et al. The entirety of the aforementioned application is incorporated herein by reference for all purposes.

FIELD OF THE INVENTION

Embodiments are related to systems and methods for forming vias in a substrate, and more particularly to systems and methods for reducing substrate surface disruption during via formation.

BACKGROUND

Manufacturing of electronics devices often involves forming vias within a substrate. As an example, vias may be formed in a substrate and metalized to form an electrical connectivity from one surface of the substrate to the opposite surface. At times the metal deposited in the vias can interfere with later formation of thin-film-transistors; electrical conductor lines; and other electronic, optical, or physical elements on the surface of the substrate. Further, any partially filled vias result in a gas leak making processing on a vacuum chuck unstable. Where the vias are not metalized until after formation of thin-film-transistors; electrical conductor lines; and other electronic, optical, or physical elements on the surface of the substrate, vias may become clogged with materials used during thin-film transistor formation. Further, all of the open vias make the intermediate system incompatible with the use of a vacuum chuck.

Hence, for at least the aforementioned reasons, there exists a need in the art for advanced systems and methods for manufacturing electronic devices.

SUMMARY

Embodiments are related to systems and methods for forming vias in a substrate, and more particularly to systems and methods for reducing substrate surface disruption during via formation.

This summary provides only a general outline of some embodiments. The phrases "in one embodiment," "according to one embodiment," "in various embodiments", "in one or more embodiments", "in particular embodiments" and the like generally mean the particular feature, structure, or characteristic following the phrase is included in at least one embodiment, and may be included in more than one embodiment. Importantly, such phrases do not necessarily refer to the same embodiment. Many other embodiments will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

Figure 1:
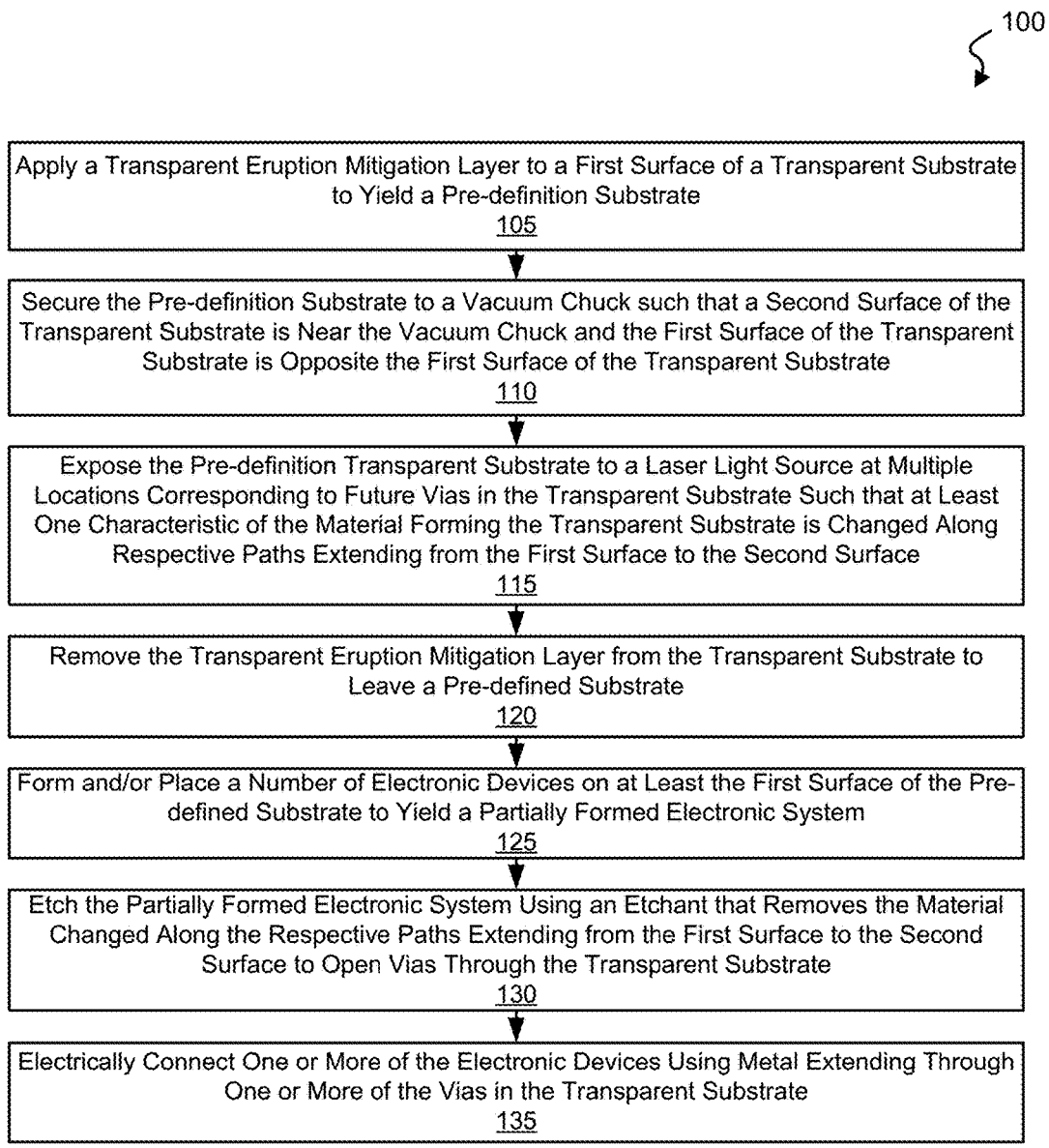
FIG. 1 is a flow diagram showing a method for manufacturing transparent substrate systems in accordance with some embodiments.

DETAILED DESCRIPTION OF SOME
EMBODIMENTS

Embodiments are related to systems and methods for forming vias (through hole vias and/or blind vias) in a substrate, and more particularly to systems and methods for reducing substrate surface disruption during via formation.

Various embodiments provide methods for forming vias and non-via structures in a transparent substrate. Such transparent substrates have a variety of applications including, but not limited to, micro light emitting diode (microLED) displays. MicroLED displays in general have benefits of higher brightness and contrast ratio as compared to liquid crystal displays (LCD) and organic light emitting diode (OLED) displays. Other benefits also exist depending on the specific application. To enable high resolution and large area displays, there is interest in fabricating microLED displays with active matrix backplanes based on oxide thin-film-transistors (TFTs) or low temperature poly-silicon (LTPS). Conventional configurations utilize top emitting microLED panels with the driver boards located on a display backside. While some embodiments discussed herein find particular application to the manufacture of microLED displays, they are not limited to microLED displays. Other applications can include antennas, circuit boards, sensors, lighting, photovoltaics, fluidics, optics and integrated optics, and other device areas. Based upon the disclosure provided herein, one of ordinary skill in the art will recognize a variety of applications beyond microLED displays to which the embodiments discussed herein may be applied.

As used herein, the term "via" is used in its broadest sense to include any opening extending into a surface, such as, but not limited to, through hole vias, blind vias, or other bulk features that can be predefined before fabrication of electronic devices on the surface of the transparent substrate. Such pre-definition before fabrication may include, but is not limited to, creating a pattern corresponding to a latent via that is subsequently processed into a formed via.

As used herein, the phrase "transparent substrate" is used in its broadest sense to mean any workpiece formed from a material that is sufficiently transparent to allow for at least some light emitted from a light source to pass through the substrate. As an example, a transparent substrate may be, but is not limited to, a workpiece made of a material with an optical absorption of less than about twenty percent (20%) per millimeter depth. As another example, a transparent substrate may be, but is not limited to, a workpiece made of a material with an optical absorption of less than about ten percent (10%) per millimeter depth for a specified pulsed laser wavelength. As yet another example, a transparent substrate may be, but is not limited to, a workpiece made of a material with an optical absorption of less than about one percent (1%) per millimeter depth for a specified pulsed laser wavelength. A transparent substrate can be made of glass, glass ceramic, ceramic, or other material depending upon the particular application, and may consist of a single layer of a single material, a composite, or a multi-layer stack of different or the same materials. The substrate can be a rigid sheet or a flexible substrate compatible with roll-to-roll processing. As used herein, the term "substrate" unmodified by the term "transparent" can refer to a transparent substrate as previously described, and can also include materials having any degree of transparency or opaqueness with respect to light from any source or wavelength. Based upon the disclosure provided herein, one of ordinary skill in the art will recognize a variety of substrates and/or transparent substrates that may be used in relation to different embodiments.

Metalized vias in a transparent substrate are an option for interconnecting the microLED and TFT arrays on the substrate top surface with the driver boards or other electronics underneath. The traditional printed circuit board assembly methodology including formation and metalization of vias followed by formation of electrical devices in relation to the vias has demonstrated various limits when applied to transparent substrate based display manufacture. Such limits include, but are not limited to, 1) non-planarity of the substrate surface, 2) metal contamination of the electronic devices formed on the substrate, and 3) significant thermal expansion differences between the metal in the via and the surrounding transparent substrate. Various embodiments discussed herein provide novel approaches to manufacturing transparent substrates having metalized through hole vias and electronic devices formed thereon. In some but not all cases, embodiments discussed herein address one or more of the limitations discussed above.

As used herein, the phrase "electronic device" is used in its broadest sense to mean any structure that is either powered or controlled by application of an electrical voltage, current, and/or an electrical signal, and/or any element or structure that operates in relation to a structure either powered or controlled by application of an electrical voltage, current, and/or signal. Thus, an electronic device includes, but is not limited to, a thin film transistor, a metal conductor line, an active matrix backplane, a passive matrix interconnect, an LED, an optical structure separate from an LED but used in relation to an LED, and/or a fluidic element. Based upon the disclosure provided herein, one of ordinary skill in the art will recognize a variety of electronic devices (either fully or partially formed) that may be used in relation to different embodiments. In addition, embodiments may also be used for non-electronic device applications such as optical, fluidic as examples.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially similar" is intended to denote that two values or conditions are equal or approximately equal. In some embodiments, "substantially similar" may denote values within about 10% of each other, such as within about 5% of each other, or within about 2% of each other.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

Some embodiments provide methods for forming a substrate including both a via and a non-via structure. The methods include laser damaging a substrate using a quasi-non-diffracting beam through a transparent eruption mitigation layer to yield defined path extending from a first surface of the substrate to a second surface of the substrate at a location where a via is to be formed. In some cases, the defined path may be referred to as a damage track. The methods further include: forming a non-via structure on the substrate after the non-ablative laser drilling; forming a protective coating over at least a portion of the non-via structure and a surface of the substrate; after forming the protective coating, etching the substrate such that substrate material around the predefined path is removed at a higher rate than substrate material at other locations on the substrate, wherein a via is formed at a location corresponding to the defined path; and conformally coating the inner walls of the via with a conductive layer.

Other embodiments provide methods for forming a substrate including both a via and a non-via structure. The methods include: performing a via pre-definition on a substrate wherein at least one defined path through the substrate is created; forming a non-via structure on the substrate after the via pre-definition; and after forming the non-via structure on the substrate, etching the substrate such that substrate material around the predefined path is removed at a higher rate than substrate material at other locations on the substrate, wherein a via is formed at a location corresponding to the defined path. The via can be a through feature or a blind, non-through structure.

In some instances of the aforementioned embodiments, the substrate is a transparent substrate. In one or more instances of the aforementioned embodiments, the substrate is one of a glass substrate, a glass-ceramic substrate, or a ceramic substrate. In various instances of the aforementioned embodiments, the methods further include applying a protective layer over the substrate prior to performing the via pre-definition such that the via pre-definition is done through the protective layer. In some such instances, the protective layer includes a sheet of material at least partially transparent to a defined wavelength of light. In other such instances, applying the protective layer over the substrate includes non-adhesively placing the protective layer on the substrate. In yet other instances of the aforementioned embodiments, applying the protective layer over the substrate includes adhesively attaching the protective layer to the substrate. In yet further instances of the aforementioned embodiments, applying the protective layer over the substrate includes depositing a protective material over at least one surface of the substrate.

In one or more instances of the aforementioned embodiments, the via pre-definition includes non-ablative laser drilling that forms the predefined path extending from a first surface of the substrate to a second surface of the substrate. In some instances of the aforementioned embodiments, the via pre-definition includes quasi-non-diffracting drilling that forms the predefined path extending from a first surface of the substrate to a second surface of the substrate. In such instances, the predefined path includes material of the substrate in which at least one characteristic has been changed compared with material of the substrate that was not exposed to the quasi-non-diffracting drilling. In some cases, the at least one characteristic is density. In various cases, changing the at least one characteristic makes the material of the substrate in which the at least one characteristic has been changed etch at least two times as fast as material of the substrate that was not exposed to the quasi-non-diffracting drilling.

In some instances of the aforementioned embodiments, the via pre-definition includes ablative laser drilling that forms the predefined path extending from a first surface of the substrate to a second surface of the substrate. In some such instances, the via pre-definition includes percussive drilling using a laser beam with a Gaussian spatial profile. For blind vias, the pre-definition does not need to exist completely through the substrate thickness.

In one or more instances of the aforementioned embodiments, the methods further include forming a protective coating over at least the non-via structure prior to etching the substrate. The protective coating operates to reduce damage to the non-via structure during etching of the substrate. In some cases, forming the protective coating further includes forming the protective coating over at least a portion of the surface of the substrate, and wherein the protective coating further operates to reduce damage to the portion of the surface of the substrate during etching of the substrate. In some cases, the protective coating is chromium oxynitride (CrON). In various cases, the methods further include removing at least a portion of the protective coating after etching the substrate is completed.

Various instances of the aforementioned embodiments further include forming a conductive material in the via. In some cases, forming the conductive material in the via includes conformally coating at least a portion of walls of the via with a metal.

Yet other embodiments provide electronic systems that include: a substrate having a plurality of vias extending from a first surface of the substrate to a second surface of the substrate where each of the plurality of vias exhibit a mid-diameter half way between the first surface and the second surface of the substrate that is more than fifteen percent less than a first diameter at the first surface of the substrate or a second diameter at the second surface of the substrate; a non-via structure formed on at least the first surface of the substrate; and a conductive material on an inner wall of at least one of the plurality of vias. An opening in the conductive material at least twenty-five percent of the distance from the first surface of the substrate to the second surface of the substrate has a diameter greater than zero. In some instances of the aforementioned embodiments, the substrate is a transparent substrate. In one or more instances of the aforementioned embodiments, the substrate is a glass substrate, a glass-ceramic substrate, or a ceramic substrate. In various instances of the aforementioned embodiments, the conductive material is a metal.

In various instances of the aforementioned embodiments, an opening in the conductive material at all locations within the via exhibits a non-zero diameter. In particular instances of the aforementioned embodiments, the mid-diameter is more than twenty percent less than the first diameter or the second diameter. In more particular embodiments of the aforementioned embodiments, the mid-diameter is more than thirty percent less than the first diameter or the second diameter.

In one or more instances of the aforementioned embodiments, the non-via structure is more than one hundred micrometers (100 µm) and less than five hundred micrometers (500 µm) away from an edge of one of the plurality of vias at the first surface of the substrate. In more particular instances of the aforementioned embodiments the non-via structure is more than one hundred micrometers (100 µm) and less than two hundred micrometers (200 µm) away from an edge of one of the plurality of vias at the first surface of the substrate.

Turning to FIG. 1, a flow diagram 100 shows a method for manufacturing transparent substrate systems in accordance with some embodiments. Following flow diagram 100, a transparent eruption mitigation layer is applied to a first surface of a transparent substrate to yield a pre-definition substrate (block 105). It has been found that placing the transparent eruption mitigation layer on the transparent substrate prior to exposing the transparent substrate to photonic energy used during, for example, quasi-non-diffracting drilling (e.g., Gauss-Bessel or Bessel beam drilling) substantially reduces the height of a crater at the surface of the transparent substrate that surrounds the location where the via is to be formed. Such quasi-non-diffracting drilling is substantially non-ablative producing very little debris.

The transparent eruption mitigation layer may be made of any material that is: partially or fully transparent to a wavelength of light emitted from a laser light source that will be used in subsequent processes to expose the transparent substrate at locations where vias are to be formed, and capable of being non-permanently placed on the first surface of the transparent substrate. In some cases, the transparent eruption mitigation layer is applied by laying it on the first surface of the transparent substrate without using an adhesive. Non-adhesive application allows for later removal without cleaning adhesive residue from the first surface of the transparent substrate. In at least one particular case, when the transparent eruption mitigation layer is placed on the first surface of the transparent substrate an electrostatic attraction occurs between the transparent eruption mitigation layer and the first surface of the transparent substrate causes the two to stick together without using an adhesive. In such cases, the transparent eruption mitigation layer can be readily separated from the transparent substrate without leaving an adhesive residue. In other cases, the transparent eruption mitigation layer is applied by adhesively attaching it to the transparent substrate. In yet other cases, the transparent eruption mitigation layer is deposited as a thin film on the transparent substrate. Such a thin film may be, but is not limited to, chromium oxynitride (CrON). Based upon the disclosure provided herein, one of ordinary skill in the art will recognize a variety of materials that may be used as the transparent eruption mitigation layer in accordance with different embodiments.

The transparent substrate may be formed of any material that is: sufficiently transparent to a wavelength of light emitted from a laser light source used in relation to block 115 discussed below that it allows at least some light from the laser light source to pass through the transparent substrate; and is capable of supporting the formation of vias and electronic devices.

An example attribute of the transparent substrate is the ability to support predefined vias in the substrate and then support full formation of vias at locations corresponding to the latent, predefined vias after intermediate processes of forming electronic devices on the transparent substrate. As an example, the transparent substrate can be a Corning® EAGLE XG®, Lotus™ NXT, or other alkaline earth boro-aluminosilicate substrate. Where TFTs are to be formed as electronic devices on the transparent substrate, the transparent substrate can include an alkali-free composition. In other cases, the substrate can also include an alkali-containing composition suitable for ion exchange processing so long as the respective structure is compatible with the intended electronic structures to be fabricated thereon. High purity fused silica (HPFS) substrates are also possible. Processing of the substrate can be as a free-standing sheet, a substrate bonded temporarily to a carrier, or a web that is compatible with roll-to-roll processing. The substrate material can, for example, have a Young's modulus in the range of 60-90 GPa. The glass composition can, for example, have a strain point in the range of 500-900 C. The substrate composition can, for example, have a thermal expansion coefficient in the range of 2-10 ppm/C. While the aforementioned examples discuss applications using specific substrate materials, other substrate materials are possible in accordance with other embodiments. For example, embodiments using high purity fused silica substrates are possible. Such high purity fused silica has a thermal expansion coefficient of about 0.5 ppm/C.

Example substrates can, for example, have a thickness between 0.01 mm and 1 mm, between 0.01 mm and 0.7 mm, between 0.01 mm and 0.5 mm, between 0.01 mm and 0.3 mm, or between 0.01 mm and 0.1 mm. The substrate can, for example, have a thickness in the range from 0.1 mm to 3 mm, 0.1 mm to 1.1 mm, 0.1 mm to 0.7 mm, or 0.3 mm to 0.5 mm. The substrate size can, for example, also be (1) a wafer with, for example, a 100 mm, a 150 mm, or a 200 mm diameter, (2) a web with a width of less than 1000 mm, and a length of greater than 10 m, or (3) a sheet with a linear dimension greater than 100 mm. The substrate can, for example, also have a linear dimension or diameter in the range of 100 mm to 4000 mm. The aforementioned are example substrate configurations, and based upon the disclosure provided herein, one of ordinary skill in the art will recognize a variety of other substrate configurations that are possible in accordance with different embodiments. Also, the substrate configuration does not need to be the same during each of the stages of via pre-definition, electronic device formation, via etch, and/or via metalization. For example, the substrate during the via formation and metallization steps can be smaller than during the via pre-definition and electronic structure processing steps. In some embodiments, an example substrate may also have UV transmission properties that enable backside exposure during electronic device fabrication.

Figure 2A:
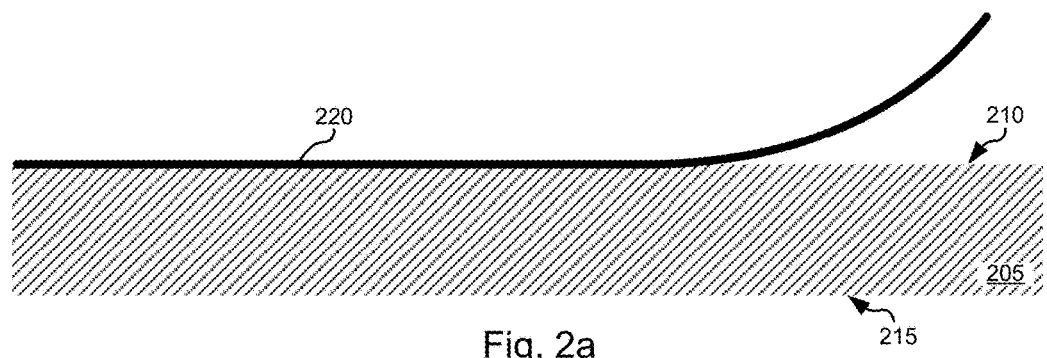
FIGS. 2a-2g show a subset of processing steps in accordance with one or more embodiments including application of a transparent eruption mitigation layer to a transparent substrate consistent with the method shown in FIG. 1.

Turning to FIG. 2a, one example of a process of applying a transparent eruption mitigation layer 220 to a first surface 210 of a transparent substrate 205 is shown. In addition, a second surface 215 of transparent substrate 205 is shown opposite the first surface. While transparent eruption mitigation layer 220 is shown as flexibly applied, other embodiments may use a rigid transparent eruption mitigation layer, or a thin film deposited on the surface of the transparent substrate. Transparent eruption mitigation layer 220 can also be applied to both the first and second surface of the substrate. The transparent eruption mitigation layer 220 can also be patterned and non-continuous.

Figure 2B:
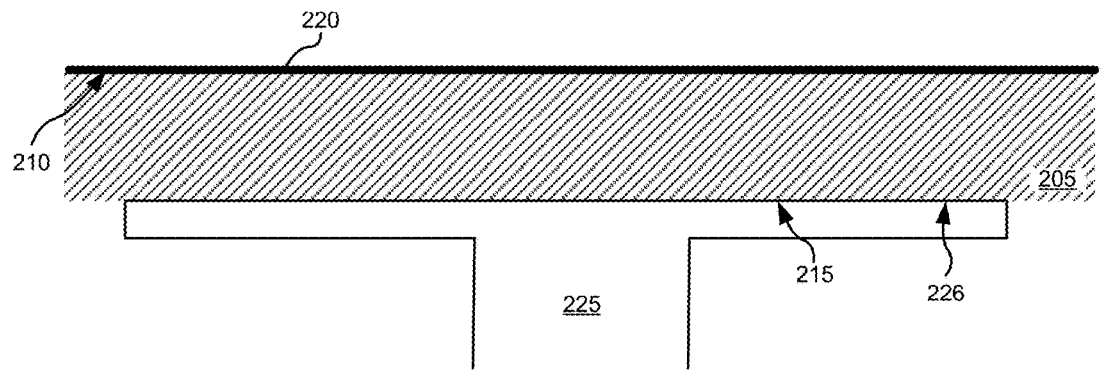

Returning to flow diagram 100 of FIG. 1, the pre-definition substrate is attached to a vacuum chuck to hold it in place during various processing steps (block 110). Use of a vacuum chuck is possible because of the delay in etching vias until after formation of electronic devices on the surface of the transparent substrate. The pre-definition substrate is attached to the vacuum chuck such that the first surface of the transparent substrate over which the transparent eruption mitigation layer is applied is away from the vacuum chuck, and a second surface of the transparent substrate opposite the first layer is near the vacuum chuck. Turning to FIG. 2b, one example of a process of attaching the pre-definition substrate to a vacuum chuck 225 is shown. Second surface 215 of transparent substrate 205 is placed near an upper surface 226 of vacuum chuck 225, and first surface 210 of substrate 205 is away from vacuum chuck 225.

Continuing with flow diagram 100 of FIG. 1, the pre-definition substrate is exposed to photonic energy from a laser light source at multiple locations corresponding to future vias in the transparent substrate (block 115). This exposure to the photonic energy changes at least one characteristic of the transparent substrate along defined paths extending from the first surface of the transparent substrate to the second surface of the transparent substrate. In some embodiments, the laser light source is from a laser capable of quasi-non-diffracting drilling (e.g., Gauss-Bessel or Bessel beam drilling). In some cases, the characteristic of the transparent substrate that is changed by exposure to the laser light source is density caused by a melting of the substrate along the defined paths. In various cases, the characteristic of the material that is changed by exposure to the laser light source is refractive index, which may be changed with or without a density change. Such defined paths may be alternatively referred to as "damage tracks" extending through the transparent substrate. By changing, for example, the density of the material along a defined path from the first surface of the transparent substrate to a second surface of the transparent substrate, the transparent substrate along the defined paths is made more susceptible to etching relative to other areas of the substrate. In some cases, an etch ratio of 9:1 (i.e., a rate of etch of the defined path is nine times greater than the rate of etch for areas of the transparent substrate surrounding the defined paths) is achieved. As the transparent substrate is sufficiently transparent to allow photonic energy from the laser light source to pass through, the change in characteristic of the transparent substrate along the defined paths is substantially uniform from the first surface to the second surface of the transparent substrate. In some cases, the aforementioned defined paths are compatible with thermal cycles and process conditions used for fabricating electronic devices disposed over the transparent substrate. In particular cases, to be compatible with both LTPS and oxide TFT fabrication, some embodiments can combine via pre-definition with a low-compaction transparent substrate such as Lotus NXT. Based upon the disclosure provided herein, one of ordinary skill in the art will recognize other materials from which the transparent substrate may be formed that will provide compatibility between forming the predefined paths and later electronic device formation.

In at least one particular embodiment where transparent substrate is a half millimeter (0.5 mm) thick sheet of Lotus NXT glass, the quasi-non-diffracting drilling is performed using a Coherent Hyper-Rapid 50 Laser, operating at five hundred, thirty-two nanometers (532 nm) and delivering approximately seven picosecond (7 ps) width pulses of photonic energy. The laser is capable of "burst mode" operation, where pulses are clustered in short "bursts" of two to twenty pulses, with each pulse separated by approximately twenty nanoseconds (20 nsec). The number of pulses/bursts used to form the defined paths ranges from fifteen (15) to twenty (20) at approximately eighty to one hundred micro Joules (80-120 uJ/burst) delivered to the substrate. The laser beam is formed into a focal line, or Gauss-Bessel beam, by employing an axicon combined with two lenses that form a telescope. The axicon forms a Bessel-like beam at its tip, and the two lenses serve to re-image and de-magnify the focal line so that it is projected to a convenient location after the telescope where a transparent substrate such as a glass wafer or glass panel may easily be placed. The length of the focal line is approximately 0.75 millimeters (full-width at half maximum), and the diameter of the focal line is approximately 1.2 micrometers. The specific laser conditions, such as burst energy, number of pulses per burst, and focal line length and diameter. The laser conditions can be optimized for generating a strong modified region in the transparent substrate without creating microcracks. This allows an etchant to penetrate the modified regions and form a cylindrical or hourglass shaped via with smooth sides, but without creating undesirable feature like "lumps" in the via sidewall that arise if microcracks are present. Such lumps are problematic during the metallization process as they can act as stress concentrators resulting in reliability issues. If the transparent substrate material is changed from the aforementioned Lotus NXT glass to another material, such as the Eagle XG, then the above conditions need to be adjusted slightly, but not significantly. For example, where Eagle XG glass is used as the transparent substrate, the burst energy may be reduced slightly (e.g., 10%) when compared with the burst energy used for the abovementioned Lotus NXT glass. Based upon the disclosure provided herein, one of ordinary skill in the art will recognize different numbers of pulses and/or pulse energies that may be used in relation to different embodiments.

In some cases, mechanical surface strength of the transparent substrate with via pre-definition sites can be higher than that of: 1) substrates with fully formed vias, and 2) substrates with fully formed and metalized vias. The substrate with predefined, latent via locations can have a surface strength with less than fifty percent (50%) difference from a TFT compatible reference sheet of similar thickness with no predefined via locations. In particular cases, the substrate with predefined via locations can have a surface strength with less than thirty percent (30%) difference from a TFT compatible reference sheet of similar thickness with no predefined via locations. In more particular cases, the substrate with predefined via locations can have a surface strength with less than ten percent (10%) difference from a TFT compatible reference sheet of similar thickness with no predefined via locations. In yet more particular cases, the substrate with predefined via locations can have a surface strength with less than five percent (5%) difference from a TFT compatible reference sheet of similar thickness with no predefined via locations.

In some cases, the defined paths through the transparent substrate created by exposure to the laser light are less than ten micrometers (10 μm) in diameter. In more particular cases, the defined paths created by exposure to the laser light are less than five micrometers (5 μm) in diameter. In yet more particular cases, the defined paths created by exposure to the laser light are less than two micrometers (2 μm) in diameter. In some cases, a crater like feature occurring at the first surface (i.e., the laser incident surface) of the transparent substrate at a via location is less than ten micrometers (10 μm) in diameter. In more particular cases, a crater like feature occurring at the first surface (i.e., the laser incident surface) of the transparent substrate at a via location is less than five micrometers (5 μm) in diameter. In various cases, a crater like feature occurring at the second surface (i.e., the laser exit surface) of the transparent substrate at a via location is less than ten micrometers (10 μm) in diameter. In more particular cases, a crater like feature occurring at the second surface (i.e., the laser exit surface) of the transparent substrate at a via location is less than five micrometers (5 μm) in diameter. In some cases, a crater like features occurring at the first surface has a diameter that is substantially the same as that of a crater like features occurring at the second surface. In some cases, the difference in diameter of a crater like feature in the first surface and a crater like feature in the second surface is less than two micrometers (2 μm). Use of the transparent eruption mitigation layer reduces the height of the crater like features extending from the first surface of the transparent substrate when compared with non-covered transparent substrates. In some cases, the height of the crater like features extending from the first surface of the transparent substrate is reduced between one thousand, five hundred nanometers (1500 nm) peak to valley and eight hundred nanometers (800 nm) peak to valley when the transparent eruption mitigation layer is a YY-100 coating. While this embodiment discusses covering only the first surface of the transparent substrate with a transparent eruption mitigation layer, other embodiments may include covering both the first surface and the second surface of the transparent substrate. Based upon the disclosure provided herein, one of ordinary skill in the art will recognize a variety of laser light sources that may be used in relation to different embodiments.

Figure 2C:
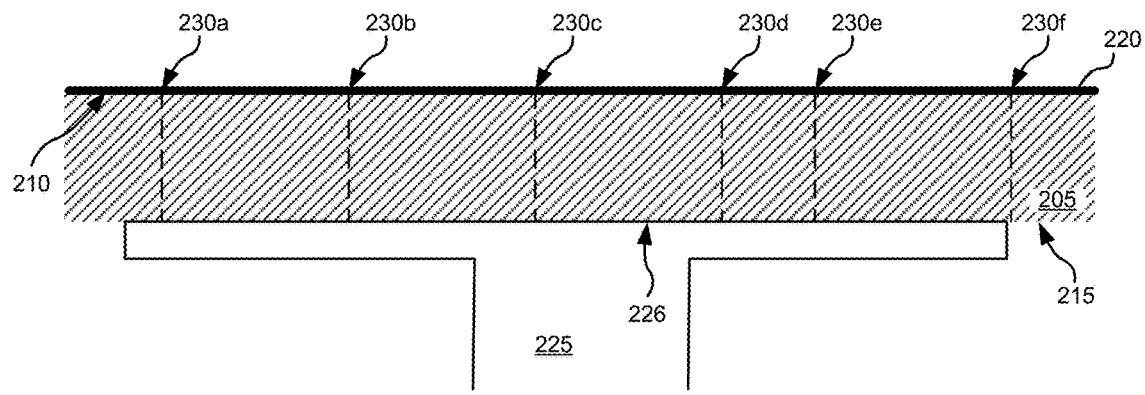
Figure 3A:
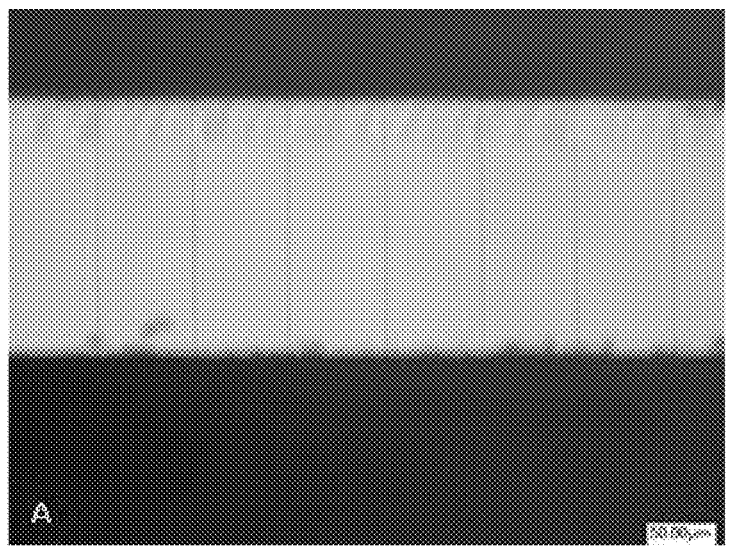
FIGS. 3a-3f are photographs of intermediate systems formed at different junctures of the method described in relation to FIG. 1, FIG. 4, FIG. 6 and/or FIG. 8.
Figure 3B:
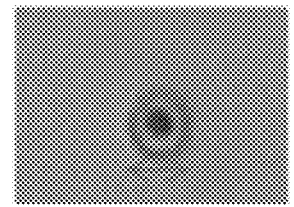

Turning to FIG. 2c, one example of a process of exposing the transparent substrate to photonic energy from a laser light source is shown. In particular, exposure to the photonic energy is done through transparent eruption mitigation layer 220 resulting in defined paths 230a-f (shown as dashed lines) extending from first surface 210 of transparent substrate 205 to second surface 215 of transparent substrate 205. Turning to FIG. 3a, a side view photograph of a transparent substrate after quasi-non-diffracting drilling resulting in defined paths extending through the substrate consistent with that described above in relation to FIG. 1 is shown. FIG. 3b is a photograph of a top surface of a transparent substrate showing a top of a defined path that measures three micrometers (3 μm) in diameter.

Figure 2D:
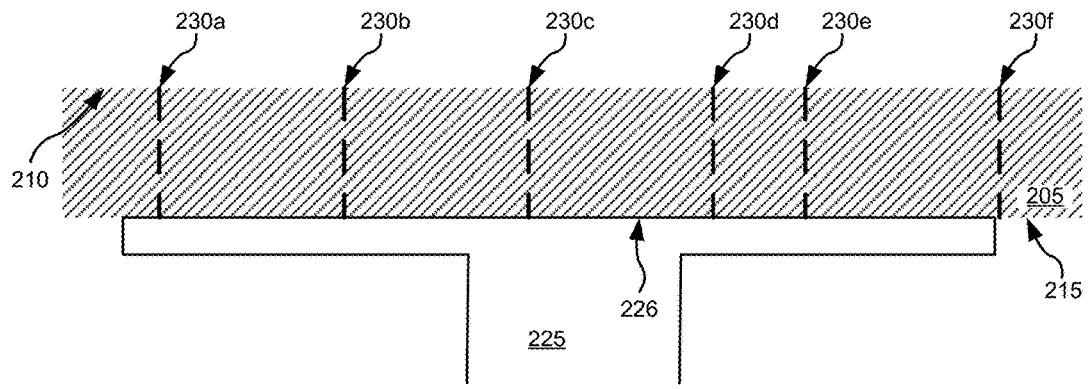

Continuing with flow diagram 100 of FIG. 1, the transparent eruption mitigation layer is removed from the transparent substrate leaving a predefined substrate (block 120). Where the transparent eruption mitigation layer was non-adhesively applied to the transparent substrate, removal is done by pulling it away from the glass substrate. Alternatively, where the transparent eruption mitigation layer was adhesively applied to the transparent substrate, removal may include both pulling it away from the transparent substrate and cleaning the transparent substrate to remove any adhesive residue. As yet another example, where the transparent eruption mitigation layer was deposited on the transparent substrate using, for example, some form of chemical vapor deposition, removal may include stripping the deposited transparent eruption mitigation layer from the glass substrate using either a polishing process or a chemical washing process. Based upon the disclosure provided herein, one of ordinary skill in the art will recognize various approaches for removing the transparent eruption mitigation layer that may be used in relation to different embodiments. Turning to FIG. 2d, one example of a predefined substrate is shown after removal of the transparent eruption mitigation layer where all that remains is transparent substrate 205 having defined paths 230a-f (shown as dashed lines) extending from first surface 210 to second surface 215.

Figure 2E:
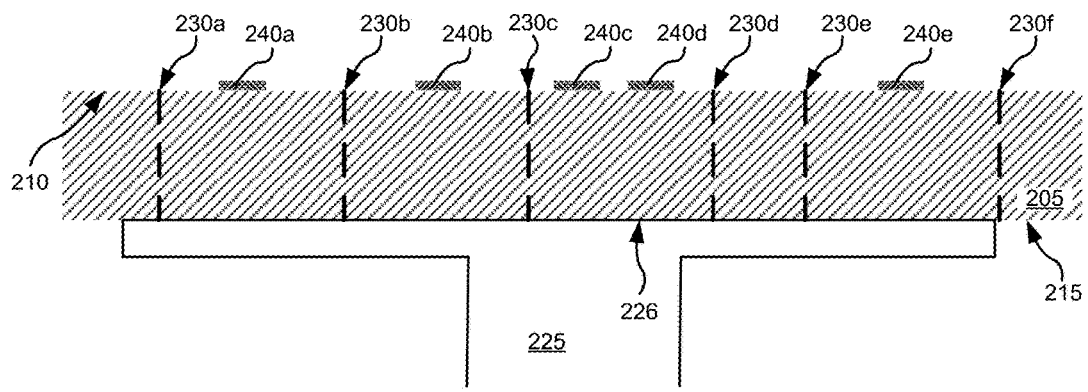

Continuing with flow diagram 100 of FIG. 1, a number of electronic devices are formed on at least one surface of the predefined substrate to yield a partially formed electronic system (block 125). The electronic devices may be fully formed in this process or may be only partially formed. In some cases where the electronic devices are only partially formed, the portion of the electronic device formed prior to etching the vias is sensitive to the surface quality of the transparent substrate, and other portions that are not as sensitive to the quality of the surface of the transparent substrate can be completed after the vias are fully formed. An integrated device, module, or system can utilize via structures as an electrical, optical, fluidic, and/or mechanical element. Turning to FIG. 2e, one example of a partially formed electronic system is shown after formation of electronic devices 240a-e on first surface 210 of transparent substrate 205.

In some cases, the electronic devices include microLEDs that are placed on or fabricated on the surface of the transparent substrate. A variety of microLED placement methods are possible such as transfer printing, laser transfer, and fluidic assembly. The microLEDs can be of a size with a linear dimension of less than two hundred micrometers (200 μm). In particular cases, the microLEDs can be of a size with a linear dimension of less than one hundred fifty micrometers (150 μm). In yet more particular cases, the microLEDs can be of a size with a linear dimension of less than one hundred micrometers (100 μm). In yet more particular cases, the microLEDs can be of a size with a linear dimension of less than fifty micrometers (50 μm). In yet more particular cases, the microLEDs can be of a size with a linear dimension of less than twenty micrometers (20 μm). In yet more particular cases, the microLEDs can be of a size with a linear dimension of less than ten micrometers (10 μm). The microLEDs can also be of similar structure and arrangement to produce a monochrome emission or they can emit at different wavelengths to produce a color display. In some embodiments, the microLEDs may be deposited on the substrate either before or after the vias have been fully formed.

Where the system is to be used in a microLED display, microLEDs may be placed or fabricated on one surface of the transparent substrate along with fabricate thin film transistors or conductor lines, and driver electronics are placed on or fabricated on the opposite side of the substrate. The driver electronics can be located on separate circuit boards or assembled onto the substrate surface directly. Such placement may be useful in enabling top emission microLEDs with either a minimal bezel and/or a tiled configuration. Conductive material (e.g., metal) interconnect may be formed through vias to provide electrical connection between the driver electronics on one side and the microLEDs on the opposite side. While some of the electronic devices discussed are specific to displays, application of the embodiments discussed herein is not limited to display technologies.

Since at the time electronic devices have been at least partially formed vias have not yet been etched at locations corresponding to the above mentioned defined paths, there is minimal disruption at the surface of the transparent substrate during electronic device formation. Because of this, in some cases the electronic devices can be placed less than five hundred micrometers (500 μm) away from one of the defined paths. In more particular cases, the electronic devices can be placed less than two hundred micrometers (200 μm) away from one of the defined paths. In yet more particular cases, the electronic devices can be placed less than one hundred micrometers (100 μm) away from one of the defined paths. In yet more particular cases, the electronic devices can be placed less than fifty micrometers (50 μm) away from one of the defined paths. In yet more particular cases, the electronic devices can be placed less than twenty micrometers (20 μm) away from one of the defined paths. In yet more particular cases, the electronic devices can be placed less than ten micrometers (10 μm) away from one of the defined paths. In yet more particular cases, the electronic devices can be placed less five micrometers (5 μm) away from one of the defined paths.

After the vias are fully formed at locations corresponding to the defined paths using later etch processes, such electronic devices can be formed such that they are ultimately less than five hundred micrometers (500 μm) away from an edge of a full formed via. In more particular cases, such electronic devices can be formed placed less than two hundred micrometers (200 μm) away from a via edge later formed at a location corresponding to one of the defined paths. In more particular cases, such electronic devices can be formed placed less than one hundred micrometers (100 μm) away from a via edge later formed at a location corresponding to one of the defined paths. In more particular cases, such electronic devices can be formed placed less than fifty micrometers (50 μm) away from a via edge later formed at a location corresponding to one of the defined paths. In more particular cases, such electronic devices can be formed placed less than ten micrometers (10 μm) away from a via edge later formed at a location corresponding to one of the defined paths.

Continuing with flow diagram 100 of FIG. 1, the partially formed electronic system is etched using an etchant that removes the material changed along the respective defined paths extending from the first surface of the transparent substrate to the second surface of the transparent substrate at a much higher rate than other materials are removed (block 130). This etching process is continued until vias extending through the transparent substrate are opened at each of the respective defined paths through the transparent substrate. Alternatively, the etching process can be performed to create a non-through hole, blind via that is either closed at one end of in the middle. In some embodiments where this etch is performed without first forming a protective layer over the electronic devices and/or other areas on the surface(s) of the transparent substrate, the chosen etchant is highly selective of the material along the respective paths to avoid substantial damage to other regions on the surface of the transparent substrate and/or the electronic devices previously formed on the transparent substrate. In other embodiments, flow diagram 100 is augmented to include a process of forming a protective layer over the electronic devices and/or other regions of surfaces of the transparent substrate that are not intended to be etched. In some cases where a protective layer of a one hundred, eighty nanometer (180 nm) thick layer of chromium oxynitride is formed over areas not intended to be etched is used, hydrofluoric acid (HF) can be used as the etchant to make vias extending two hundred micrometers (200 µm) from the first surface of the transparent substrate to the second surface of the transparent substrate. As one particular example, a 1.45M hydrofluoric acid (HF) solution held at eight degrees Celsius (8° C.) yields an etch rate of approximately 0.21 µm/minute for a total etch time of six to seven hours. The lower etching temperature slows bulk reaction rate to allow more relative diffusion into the damage tracks. If a smaller waist in the via could be accepted a higher temperature/faster process time may be employed. Mineral acid such as 1.58M nitric acid (HNO3) has been used in the past to increase solubility of potential byproducts however it may increase chances of oxidation and delamination of a chromium oxynitride (CrON) layer. Ultrasonics should also be avoided as they may delaminate the protective chromium oxynitride (CrON) layer. Any attempt to increase diffusion into vias should be done by chemical means or gentle agitation so not to disturb the surface layers.

Such processes of forming a protective layer and later removal of the protective layer are discussed in relation to other embodiments herein. Because the footprint of the respective defined paths through the transparent substrate are substantially the same and etching is done from both sides (i.e., both the first surface and the second surface of the transparent substrate are in contact with the etchant), the formed vias exhibit an hourglass shape wider near the first surface and the second surface and narrower in the center region. Based upon the disclosure provided herein, one of ordinary skill in the art will recognize a variety of other etchants that may use used in relation to embodiments discussed herein including, but not limited to basic solutions such as potassium hydroxide (KOH) and sodium hydroxide (NaOH). In addition, masking techniques for the second surface can be used to enable a single-sided etch process that starts at the first surface.

While the embodiment of FIG. 1 is discussed as resulting in vias having an hourglass shaped opening extending from the first surface to the second surface, other types of vias a possible by changing the etch process. For example, blind vias may be formed by etching only from one surface for a period that is insufficient to make an opening extending from the first surface to the second surface. Such blind vias may extend most of the way through the transparent substrate (e.g., leaving an un-etched portion extending from the surface opposite that to which the etchant is applied of less than five micrometers (5 µm)). The advantage of such an approach is that one surface (i.e., the surface opposite that to which the etchants is applied) remains untouched or undamaged by exposure to the etchant. In this manner, the through-hole via location can be predefined by a blind-via structure, and subsequently finished only after the pristine nature of the un-etched surface is no longer needed. The vias can also be predefined as a pilot hole with a minimum opening of less than ten micrometers (10 µm). In other cases, the predefined pilot hole exhibits a minimum opening of less than five micrometers (5 µm). In yet other cases, the predefined pilot hole exhibits a minimum opening of less than one micrometers (1 µm). In yet more particular cases, the predefined pilot hole exhibits a minimum opening of less than one half of a micrometers (0.5 µm). In some cases, predefined via structures can have a minimum diameter or width in the range of ten nanometers (10 nm) to ten thousand nanometers (10,000 nm). In other cases, predefined via structures can have a minimum diameter or width in the range of ten nanometers (10 nm) to one thousand nanometers (1000 nm). In yet other cases, predefined via structures can have a minimum diameter or width in the range of ten nanometers (10 nm) to one five hundred (500 nm). In yet other cases, predefined via structures can have a minimum diameter or width in the range of ten nanometers (10 nm) to two hundred (200 nm). In yet other cases, predefined via structures can have a minimum diameter or width in the range of ten nanometers (10 nm) to one hundred (100 nm). As another example, a though hole via etched from only one surface of the transparent substrate results in a through hole having an opening at the surface from which the etch is performed that is larger than the opening at the opposite surface.

Figure 2F:
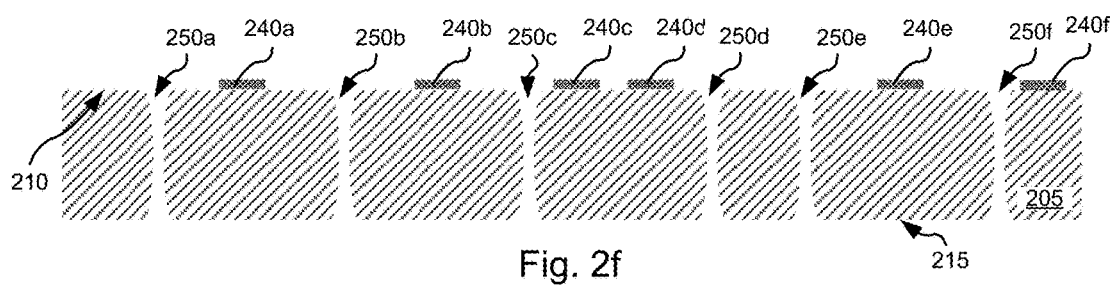
Figure 3C:
Figure 3D:
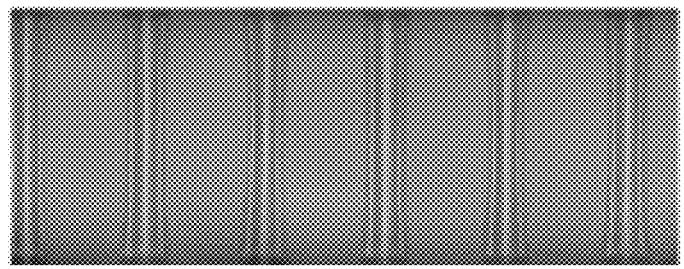
Figure 3E:
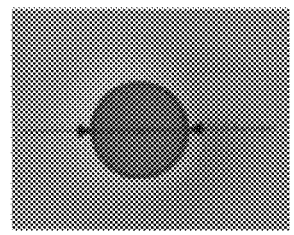

Turning to FIG. 2F, transparent substrate 205 is shown after the etching process with vias 250a-f extending from first surface 210 to second surface 215. As noted above, where either a highly selective etchant is used or a protective layer is applied before the etching process is performed, electronic devices 240a-e and other regions of first surface 210 and second surface 215 remain substantially undamaged. Again, because the footprint of the defined paths 230a-f through transparent substrate 205 are substantially the same at both first surface 210 and second surface 215 and because etching is done from both sides (i.e., both first surface 210 and second surface 215 of transparent substrate 205 are in contact with the etchant), the formed vias 250a-f exhibit an hourglass shape wider near first surface 210 and second surface 215, and narrower in the center region. If a protective layer is applied before the etching process, this may create a step structure where the material not covered by the protective layer is removed but material under the protective layer remains substantially the same. Turning to FIG. 3d, a side view photograph is shown of a substrate after etching from both sides to yield hour glass shaped vias drilling resulting in defined paths extending through the substrate consistent with that described above in relation to FIG. 1. FIG. 3e is a photograph of a top surface of a transparent substrate showing a top of an etched via that measures about forty micrometers (40 µm) in diameter.

Continuing with flow diagram 100 of FIG. 1, one or more of the electronic devices are electrically connected using metal extending through one or more of the vias in the transparent substrate (block 135). In some cases, a standard metalization process is used that completely fills the vias and connects to other metal traces on the first surface and/or the second surface of the transparent substrate. In other cases, the walls of the vias are conformally coated to provide an electrical connection from the first surface to the second surface without fully filling the vias. Such a conformal coating approach is advantageous as it reduces the impact of differential expansion and contraction between the conformally coated metal and the material of the transparent substrate during thermal cycles applied in relation to forming the electronic devices and other later processes. Further, such a conformal coating approach allows for a final structure with a higher aspect ratio when compared with fully filled vias. In some cases, using conformal coating of vias allows for aspect ratios of the vias greater than three to one (3:1). In other cases, using conformal coating of vias allows for aspect ratios of the vias greater than five to one (5:1).

Figure 2G:
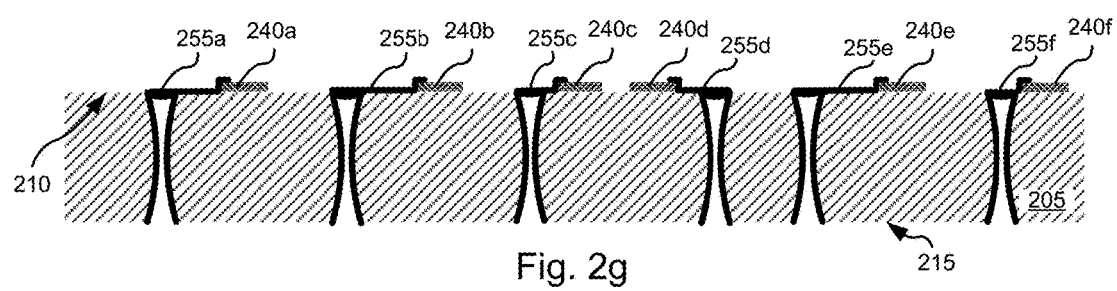
Figure 3F:
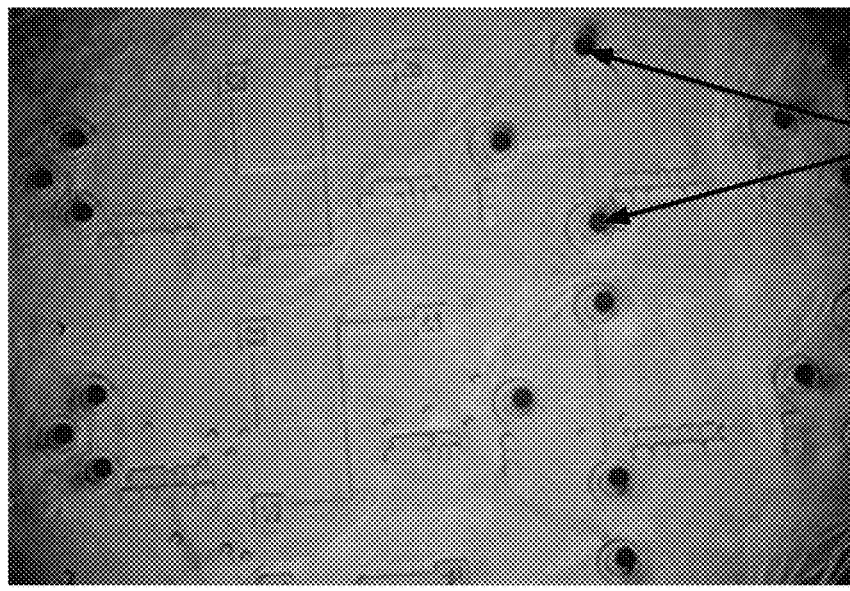

In yet other cases using conformal coating of vias allows for aspect ratios of the vias greater than ten to one (10:1). These higher aspect ratios both enable shorter etch times and may also be desirable for placing a denser array of electronic devices on an area of the surface of the transparent substrate. In some cases, finalized vias may exhibit a diameter at the narrowest, widest, or both locations in the range of five micrometers (5 μm) to five hundred micrometers (500 μm). In some cases, finalized vias may exhibit a diameter at the narrowest, widest, or both locations in the range of ten micrometers (10 μm) to two hundred micrometers (200 μm). In yet other cases, finalized vias may exhibit a diameter at the narrowest, widest, or both locations in the range of ten micrometers (10 μm) to one hundred micrometers (100 μm). In yet other cases, finalized vias may exhibit a diameter at the narrowest, widest, or both locations in the range of ten micrometers (10 μm) to fifty micrometers (50 μm). Turning to FIG. 2g, vias 250a-f through transparent substrate 215 are shown after conformal coating with a metal and formation of metal traces 255a-f extending from vias 250a-f to electronic devices 240a-e. Turning to FIG. 3f, a top view photograph is shown of an electronic system including a transparent substrate, electronic devices, and fully formed vias manufactured in accordance with processes discussed above in relation to FIG. 1.

Figure 4:
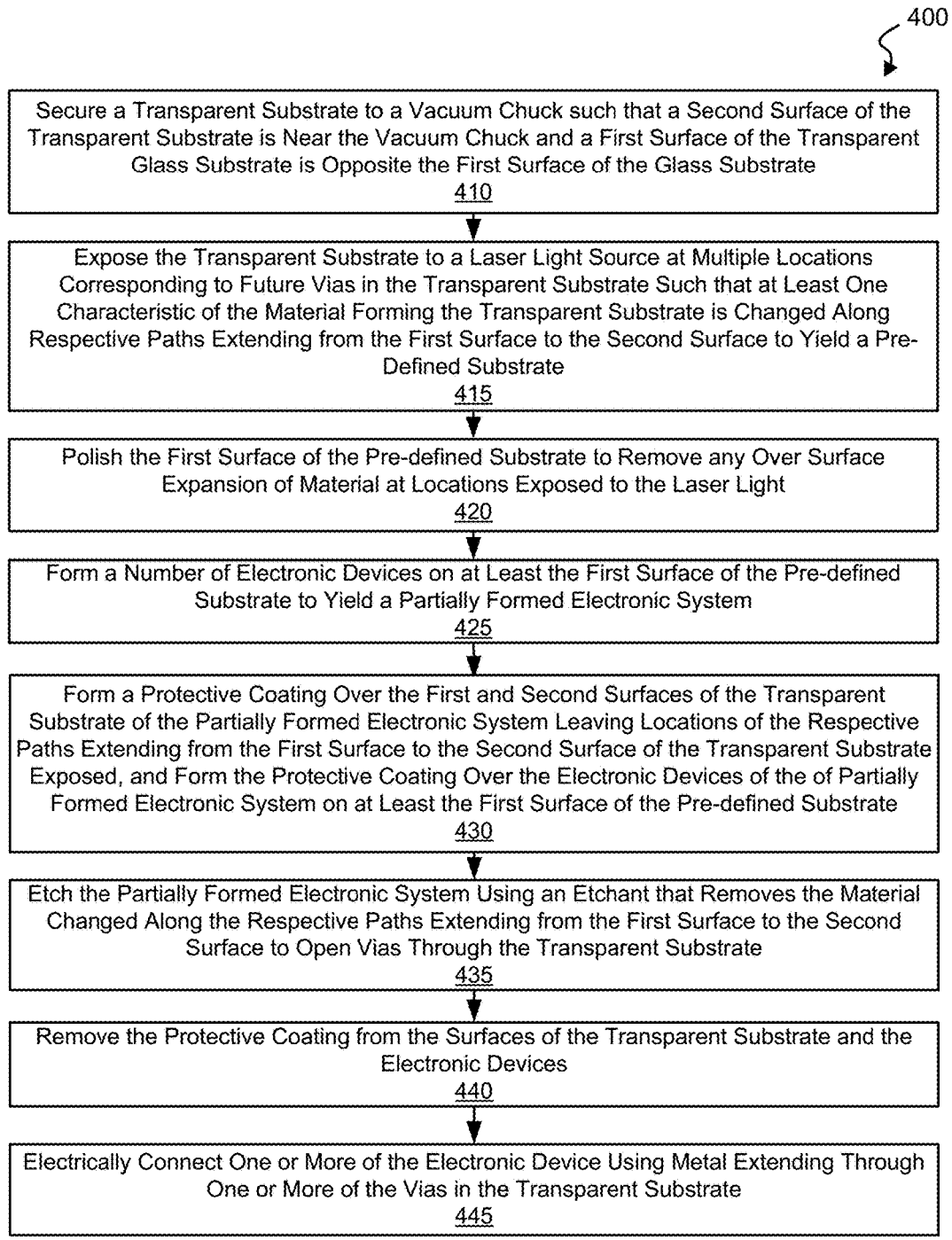
FIG. 4 is a flow diagram showing a method for manufacturing transparent substrate systems including an intermediate surface polish and formation of a protective coating to avoid damage to electronic devices during via etch processes in accordance with various embodiments.
Figure 5A:
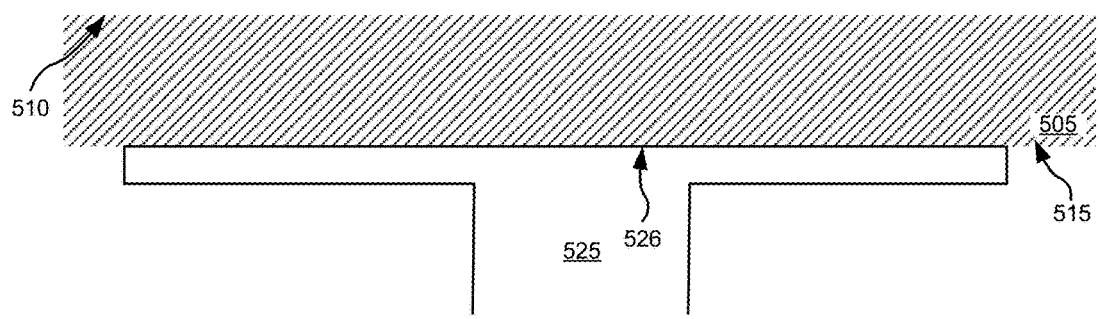
FIGS. 5a-5h show a subset of processing steps in accordance with one or more embodiments including forming and removing a protective coating to avoid damage to electronic devices during via etch processes consistent with the method shown in FIG. 4.

Turning to FIG. 4, a flow diagram 400 shows a method for manufacturing transparent substrate systems including an intermediate surface polish and formation of a protective coating to avoid damage to electronic devices during via etch processes in accordance with various embodiments. Following flow diagram 400, a transparent substrate is attached to a vacuum chuck to hold it in place during various processing steps (block 410). Use of a vacuum chuck is possible because of the delay in etching vias until after formation of electronic devices on the surface of the transparent substrate. Turning to FIG. 5a, one example of a process of attaching a transparent substrate 505 to a vacuum chuck 525 is shown. Second surface 515 of transparent substrate 505 is placed near an upper surface 526 of vacuum chuck 525, and first surface 510 of substrate 505 is away from vacuum chuck 525.

An example attribute of the transparent substrate is the ability to support predefined vias in the substrate and then support fully formation of vias at locations corresponding to the predefined vias after intermediate processes of forming electronic devices on the transparent substrate. The transparent substrate may have similar attributes to that discussed above.

Continuing with flow diagram 400 of FIG. 4, the transparent substrate is exposed to photonic energy from a laser light source at multiple locations corresponding to future vias in the transparent substrate (block 415). This exposure to the photonic energy changes at least one characteristic of the transparent substrate along respective paths extending from the first surface of the transparent substrate to the second surface of the transparent substrate. In some embodiments, the laser light source is from a laser capable of quasi-non-diffracting drilling (e.g., Gauss-Bessel or Bessel beam drilling). In some cases, the characteristic of the transparent substrate that is changed by exposure to the laser light source is density. By changing, for example, the density of the material along a defined path from the first surface of the transparent substrate to a second surface of the transparent substrate, the transparent substrate is made more susceptible to etching relative to other areas of the substrate. In some cases, an etch ratio of 9:1 (i.e., a rate of etch of the defined path is nine times greater than the rate of etch for areas of the transparent substrate surrounding the defined paths) is achieved. As the transparent substrate is sufficiently transparent to allow photonic energy from the laser light source to pass through, the change in characteristic of the transparent substrate along the paths is substantially uniform from the first surface to the second surface of the transparent substrate. In some cases, the aforementioned defined paths are compatible with thermal cycles and process conditions used for fabricating electronic devices disposed over the transparent substrate. In particular cases, to be compatible with both LTPS and oxide TFT fabrication, some embodiments can combine via pre-definition with a low-compaction transparent substrate such as Lotus NXT. Based upon the disclosure provided herein, one of ordinary skill in the art will recognize other materials from which the transparent substrate may be formed that will provide compatibility between forming the predefined paths and later electronic device formation. One advantage of a non-ablative laser drilling process is that the transparent substrate remains hermetic until the defined paths are etched to open vias.

The cross sectional profile of an example quasi-non-diffracting beam can be described by a Bessel function, and hence such laser beams are frequently referred to as Bessel beams. In a non-limiting example, the quasi-non-diffracting beam has a wavelength of about 532 nm and a numerical aperture of about 0.29, which provides a core at the center of the Bessel beam having a diameter of about 1.2 μm. The intensity of the laser beam in this core spot can be maintained over lengths of hundreds of microns, which is much longer than the diffraction limited Rayleigh range of a typical Gaussian profile beam of equivalent spot size (i.e., only a few microns).

Such an optical system can be thought of as mapping the radial (i.e., lateral) intensity distribution of the input pulsed laser beam to an intensity distribution along the optical axis to form a focal line. The length of the focal line that is produced is proportional to the diameter of the pulsed laser beam sent into the axicon. Such a quasi-non-diffracting beam is known as a Gauss-Bessel beam.

A detailed description of the formation of quasi-non-diffracting beams and determining their length, including a generalization of the description of such beams to asymmetric (such as non-axisymmetric) beam cross sectional profiles, is provided in U.S. Provisional patent application Ser. No. 15/689,456 entitled "Laser Cutting of Materials With Intensity Mapping Optical System", and filed Aug. 29, 2017 by Comstock et al. The entirety of the aforementioned application is incorporated herein by reference for all purposes.

The Rayleigh range corresponds to the distance (relative to the position of the beam waist as defined in Section 3.12 of ISO 11146-1:2005(E)) over which the variance of the laser beam doubles (relative to the variance at the position of the beam waist) and is a measure of the divergence of the cross sectional area of the laser beam. The Rayleigh range can also be observed as the distance along the beam axis at which the peak optical intensity observed in a cross sectional profile of the beam decays to one half of its value observed in a cross sectional profile of the beam at the beam waist location (location of maximum intensity). The quasi-non-diffracting beam defines a laser beam focal line having a first end point and a second end point. The first and second end points of a quasi-non-diffracting beam are defined as the locations where the quasi-non-diffracting beam has propagated a distance from the beam waist equal to a Rayleigh range of the quasi-non-diffracting beam. Laser beams with large Rayleigh ranges have low divergence and expand more slowly with distance in the beam propagation direction than laser beams with small Rayleigh ranges.

Beam cross section is characterized by shape and dimensions. The dimensions of the beam cross section are characterized by a spot size of the beam. For a Gaussian beam, spot size is frequently defined as the radial extent at which the intensity of the beam decreases to $1/e^2$ of its maximum value. The maximum intensity of a Gaussian beam occurs at the center x=0 and y=0 (Cartesian) or r=0 (cylindrical)) of the intensity distribution and radial extent used to determine spot size is measured relative to the center.

Beams with Gaussian intensity profiles may be less preferred for laser processing to form damage tracks 110 because, when focused to small enough spot sizes (such as spot sizes in the range of microns, such as about 1-5 µm or about 1-10 µm) to enable available laser pulse energies to modify materials such as glass, they are highly diffracting and diverge significantly over short propagation distances. To achieve low divergence, it is desirable to control or optimize the intensity distribution of the pulsed laser beam to reduce diffraction. Pulsed laser beams may be non-diffracting or weakly diffracting. Weakly diffracting laser beams include quasi-non-diffracting laser beams. Representative weakly diffracting laser beams include Bessel beams, Gauss-Bessel beams, Airy beams, Weber beams, and Mathieu beams.

Non-diffracting or quasi-non-diffracting beams generally have complicated intensity profiles, such as those that decrease non-monotonically vs. radius. By analogy to a Gaussian beam, an effective spot size $w_{O,eff}$ can be defined for any beam, even non-axisymmetric beams, as the shortest radial distance, in any direction, from the radial position of the maximum intensity (r=0) at which the intensity decreases to $1/e^2$ of the maximum intensity. Further, for axisymmetric beams $w_{O,eff}$ is the radial distance from the radial position of the maximum intensity (r=0) at which the intensity decreases to $1/e^2$ of the maximum intensity. A criterion for Rayleigh range based on the effective spot size $w_{O,eff}$ for axisymmetric beams can be specified as non-diffracting or quasi-non-diffracting beams for forming damage regions in Equation (1), below:

$$Z_R > F_D \frac{\pi w_{o,eff}^2}{\lambda} \quad (1)$$

where $F_D$ is a dimensionless divergence factor. For a non-diffracting or quasi-non-diffracting beam the distance, $Z_R$ in Equation (1), over which the effective beam size doubles, is $F_D$ times the distance expected if a typical Gaussian beam profile were used. The dimensionless divergence factor $F_D$ provides a criterion for determining whether or not a laser beam is quasi-non-diffracting.

In some cases, mechanical surface strength of the transparent substrate with via pre-definition sites can be higher than that of: 1) substrates with fully formed vias, and 2) substrates with fully formed and metalized vias. The substrate with predefined via locations can have a surface strength with less than fifty percent (50%) difference from a TFT compatible reference sheet of similar thickness with no predefined via locations. In particular cases, the substrate with predefined via locations can have a surface strength with less than thirty percent (30%) difference from a TFT compatible reference sheet of similar thickness with no predefined via locations. In more particular cases, the substrate with predefined via locations can have a surface strength with less than ten percent (10%) difference from a TFT compatible reference sheet of similar thickness with no predefined via locations. In yet more particular cases, the substrate with predefined via locations can have a surface strength with less than five percent (5%) difference from a TFT compatible reference sheet of similar thickness with no predefined via locations.

In some cases, the defined paths through the transparent substrate created by exposure to the laser light are less than ten micrometers (10 µm) in diameter. In more particular cases, the defined paths created by exposure to the laser light are less than five micrometers (5 µm) in diameter. In yet more particular cases, the defined paths created by exposure to the laser light are less than two micrometers (2 µm) in diameter. In some cases, a crater like feature occurring at the first surface (i.e., the laser incident surface) of the transparent substrate at a via location is less than ten micrometers (10 µm) in diameter. In more particular cases, a crater like feature occurring at the first surface (i.e., the laser incident surface) of the transparent substrate at a via location is less than five micrometers (5 µm) in diameter. In various cases, a crater like feature occurring at the second surface (i.e., the laser exit surface) of the transparent substrate at a via location is less than ten micrometers (10 µm) in diameter. In more particular cases, a crater like feature occurring at the second surface (i.e., the laser exit surface) of the transparent substrate at a via location is less than five micrometers (5 µm) in diameter. In some cases, a crater like features occurring at the first surface has a diameter that is substantially the same as that of a crater like features occurring at the second surface. In some cases, the difference in diameter of a crater like feature in the first surface and a crater like feature in the second surface is less than two micrometers (2 µm). Use of the transparent eruption mitigation layer reduces the height of the crater like features extending from the first surface of the transparent substrate when compared with non-covered transparent substrates. In some cases, the height of the crater like features extending from the first surface of the transparent substrate is reduced between one thousand, five hundred nanometers (1500 nm) peak to valley and eight hundred nanometers (800 nm) peak to valley when the transparent eruption mitigation layer is a YY-100 coating. While this embodiment discusses covering only the first surface of the transparent substrate with a transparent eruption mitigation layer, other embodiments may include covering both the first surface and the second surface of the transparent substrate. Based upon the disclosure provided herein, one of ordinary skill in the art will recognize a variety of laser light sources that may be used in relation to different embodiments.

Figure 5B:
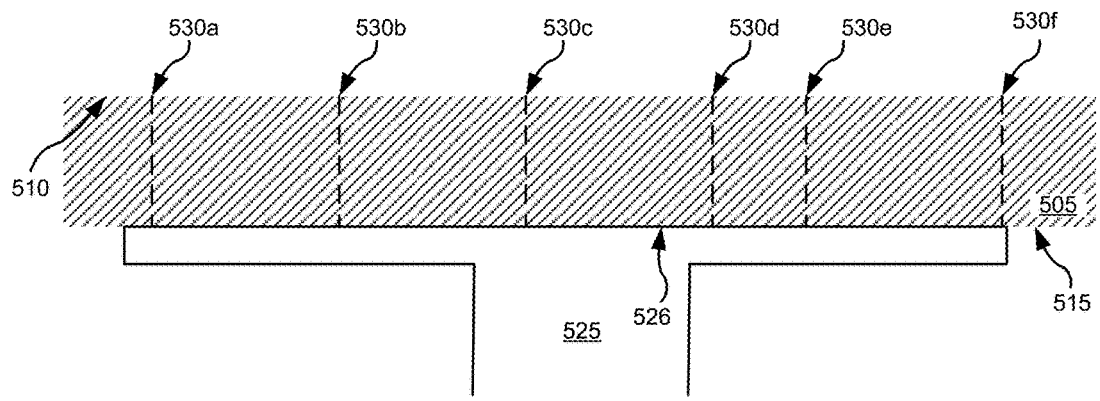

Turning to FIG. 5b, one example of a process of exposing the transparent substrate to photonic energy from a laser light source is shown. In particular, exposure to the photonic energy results in defined paths 530a-f (shown as dashed lines) extending from first surface 510 of transparent substrate 505 to second surface 515 of transparent substrate 505. Turning to FIG. 3a, a side view photograph is shown of a transparent substrate after quasi-non-diffracting drilling resulting in defined paths extending through the substrate consistent with that described above in relation to FIG. 4. FIG. 3b is a photograph of a top surface of a transparent substrate showing a top of a defined path that measures three micrometers (3 µm) in diameter.

Other approaches may be ablative processes resulting in substrate material removed from the defined paths forming debris at the surface of the substrate. One example of such an ablative process is percussive drilling using a Gaussian beam in place of the aforementioned Bessel beam. Use of percussive drilling results in a tapered pilot hole that extends from the first surface of the transparent substrate to the second surface of the transparent substrate. The pilot hole may be, for example, between fifteen and twenty micrometers (15-20 µm) at the surface closet to the laser (i.e., the incident or entrance side). At the opposite surface away from the laser (i.e., the exit side), the diameter of the pilot hole is, for example, five to eight micrometers (5-8 µm). Because of the tapering of the pilot holes, the finally formed vias are either tapered where etching is performed only from the incident surface, and a modified hourglass shape when the etching is performed from both the entrance and exit surfaces. Turning to FIG. 3c, a side view photograph is shown of a transparent substrate after use of percussive drilling of the transparent substrate to form defined paths. Where percussive drilling is used, the substrate does not need to be a transparent substrate, but rather only needs to be made of either a transparent or opaque material that is susceptible to the percussive drilling.

Continuing with flow diagram 400 of FIG. 4, the first surface of the transparent substrate is polished to remove crater like formations extending above the first surface (block 420). Such polishing may be particularly useful where percussive drilling is used to pre-define the via locations, and where Bessel beam drilling is used without a transparent eruption mitigation layer. Such polishing may be, for example, a chemical/mechanical polishing as is known in the art. While this embodiment discloses polishing of only the first layer, polishing may also be performed on the opposite layer of the transparent substrate to remove any material extending beyond the second surface of the transparent substrate. Polishing can also be performed in combination with other laser processes and not just percussive drilling.

Figure 5C:
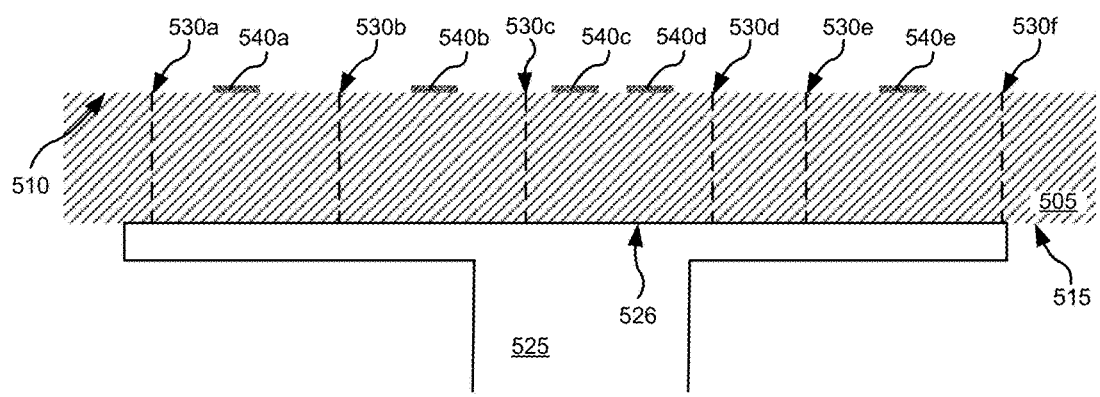

A number of electronic devices are formed on at least one surface of the predefined substrate to yield a partially formed electronic system (block 425). The electronic devices may be fully formed in this process or may be only partially formed. In some cases where the electronic devices are only partially formed, the portion of the electronic device formed prior to etching the vias is sensitive to the surface quality of the transparent substrate, and other portions that are not as sensitive to the quality of the surface of the transparent substrate can be completed after the vias are fully formed. An integrated device, module, or system can utilize via structures as an electrical, optical, fluidic, and/or mechanical element. The electronic devices may be similar to those discussed above in relation to FIG. 1. Turning to FIG. 5c, one example of a partially formed electronic system is shown after formation of electronic devices 540a-e on first surface 510 of transparent substrate 505.

Continuing with flow diagram 400 of FIG. 4, a protective coating is formed over the first surface and the second surface of the transparent substrate (block 430). This protective coating may be patterned to form an etch mask exposing the locations where vias have been predefined while covering other areas. Thus, when the surfaces of the transparent substrate are exposed to an etchant, both the surfaces of the transparent substrate and the electronic devices formed thereon are protected by the protective coating, while the etchant is in contact with exposed areas of the transparent substrate surfaces corresponding to the defined paths discussed above are etched. Alternatively, only a protective coating covering at least a portion of one of the substrate surfaces is also possible. In addition, the etch mask can be further patterned to have openings that are not associated with via locations that will allow further interaction between the etchant and the substrate or other elements In some embodiments, the use of an etch mask may result in a characteristic step feature in the substrate near the via locations or locations of mask openings. The magnitude of this step depends on the etch selectivity of the etch mask and the substrate. The etch mask material, deposition, and patterning processes may be selected to maximize its durability in the via formation process. Any delamination or etching of the etch mask should be minimized, and the etch mask should remain adhered to the substrate after removal of a desired amount of the substrate material. In one example, the combination of the material for the etch mask and the etchant are selected to allow for etching a via greater than fifty micrometers (50 µm) in depth. In a more particular example, the combination of the material for the etch mask and the etchant are selected to allow for etching a via greater than one hundred micrometers (100 µm) in depth. In a yet more particular example, the combination of the material for the etch mask and the etchant are selected to allow for etching a via greater than two hundred micrometers (200 µm) in depth. In a yet more particular example, the combination of the material for the etch mask and the etchant are selected to allow for etching a via greater than five hundred micrometers (500 µm) in depth. In yet more particular example, the combination of the material for the etch mask and the etchant are selected to allow for etching a via greater than one thousand micrometers (1000 µm) in depth. Any coating capable of protecting surfaces of the substrate and the electronic devices may be used. As one particular embodiment, the protective coating is chromium oxynitride (CrON). In one particular embodiment, a one hundred, eighty nanometer (180 nm) thick layer of chromium oxynitride is formed over areas not intended to be etched. This protective coating will protect the surfaces of the transparent substrate and electronic the element devices while vias extending two hundred micrometers (200 µm) from the first surface of the transparent substrate to the second surface of the transparent substrate using hydrofluoric acid (HF) are etched. If the second surface of the substrate is also exposed to the etchant and the substrate is less than four hundred micrometers (400 µm) thick, then a through-hole via results.

In some cases, the protective coating may maintain adhesion to the substrate during via etching depths in the range of 50 µm to 1500 µm. In more particular cases, the protective coating may maintain adhesion to the substrate during via etching depths in the range of 100 µm to 700 µm. In other cases, the protective coating may maintain adhesion to the substrate during via etching depths in the range of 300 µm to 500 µm. Patterning of the etch mask around the via location enables via etching from both substrate major surfaces. In some cases, the edge of the protective coating is placed less than five hundred micrometers (500 µm) away from the paths defined during the pre-definition process discussed above in relation to block 415. In more particular cases, the edge of the protective coating is placed less than two hundred micrometers (200 µm) away from the paths defined during the pre-definition process discussed above in relation to block 415. In yet more particular cases, the edge of the protective coating is placed less than one hundred micrometers (100 µm) away from the paths defined during the pre-definition process discussed above in relation to block 415. In yet more particular cases, the edge of the protective coating is placed less than fifty micrometers (50 µm) away from the paths defined during the pre-definition process discussed above in relation to block 415. In yet more particular cases, the edge of the protective coating is placed less than twenty micrometers (20 µm) away from the paths defined during the pre-definition process discussed above in relation to block 415. In yet more particular cases, the edge of the protective coating is placed less than ten micrometers (10 µm) away from the paths defined during the pre-definition process discussed above in relation to block 415. In yet more particular cases, the edge of the protective coating is placed less than five micrometers (5 µm) away from the paths defined during the pre-definition process discussed above in relation to block 415.

In some cases, the openings in the protective coating may range in distance from five micrometers (5 µm) to five hundred micrometers (500 µm) away from the paths defined during the pre-definition process discussed above in relation to block 415. In more particular cases, the openings in the protective coating may range in distance from ten micrometers (10 µm) to two hundred micrometers (200 µm) away from the paths defined during the pre-definition process discussed above in relation to block 415. In yet more particular cases, the openings in the protective coating may range in distance from fifty micrometers (50 µm) to two hundred micrometers (200 µm) away from the paths defined during the pre-definition process discussed above in relation to block 415.

Figure 5D:
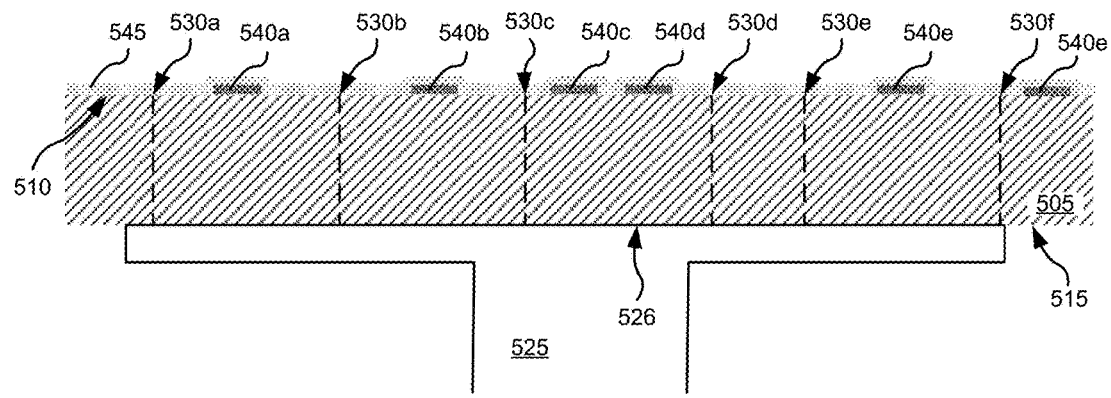
Figure 5E:
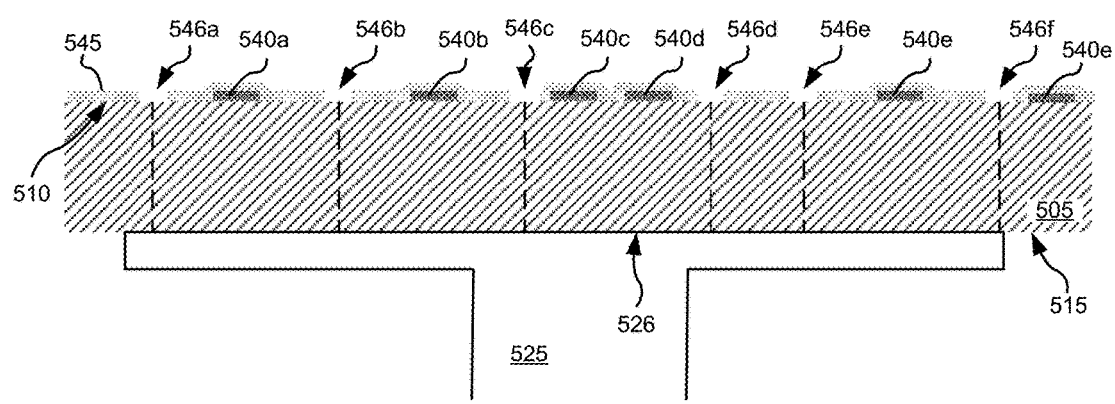

Turning to FIG. 5d, one example of a partially formed electronic system is shown with a protective coating 545 formed over electronic devices 540a-e on first surface 510 of transparent substrate 505. Where desired, second surface 515 of transparent substrate may also be covered by the protective coating. Turning to FIG. 5e, protective coating 545 is shown after a pattern and etch exposes first surface 510 of transparent substrate 505 at locations 546 corresponding to defined paths 530a-f. While FIGS. 5d-5e show only first surface 510 covered by protective coating 545, in other embodiments second surface 515 of transparent substrate 505 is also be covered by the protective coating. In such embodiments, the protective coating on second surface 515 may be patterned and etched where etching of vias corresponding to defined paths 530a-f is desired from both first surface 510 and second surface 515. Alternatively, where etching is only desired from one of first surface 510 or second surface 515, only the surface from which the etch will be performed is patterned and etch to expose locations corresponding to defined paths 530a-f.

Continuing with flow diagram 400 of FIG. 4, the partially formed electronic system is etched using an etchant that removes the material changed along the respective defined paths extending from the first surface of the transparent substrate to the second surface of the transparent substrate at a much higher rate than other materials are removed (block 435). This etching process is continued until vias extending through the transparent substrate are opened at each of the respective paths through the transparent substrate.

While the embodiment of FIG. 4 is discussed as resulting in vias etched from both sides that have an hourglass shaped opening extending from the first surface to the second surface, other types of vias a possible by changing the etch process. For example, blind vias may be formed by etching only from one surface for a period that is insufficient to make an opening extending from the first surface to the second surface. Such blind vias may extend most of the way through the transparent substrate (e.g., leaving an un-etched portion extending from the surface opposite that to which the etchant is applied of less than five micrometers (5 µm)). The advantage of such an approach is that one surface (i.e., the surface opposite that to which the etchants is applied) remains untouched or undamaged by exposure to the etchant. In this manner, the through-hole via location can be predefined by a blind-via structure, and subsequently finished only after the pristine nature of the un-etched surface is no longer needed. The vias can also be predefined as a pilot hole with a minimum opening of less than ten micrometers (10 µm). In other cases, the predefined pilot hole exhibits a minimum opening of less than five micrometers (5 µm). In yet other cases, the predefined pilot hole exhibits a minimum opening of less than one micrometers (1 µm). In yet more particular cases, the predefined pilot hole exhibits a minimum opening of less than one half of a nanometer (0.5 µm). In some cases, predefined, latent via structures can have a minimum diameter or width in the range of ten nanometers (10 nm) to ten thousand nanometers (10,000 nm). In other cases, predefined, latent via structures can have a minimum diameter or width in the range of ten nanometers (10 nm) to one thousand nanometers (1000 nm). In yet other cases, predefined, latent via structures can have a minimum diameter or width in the range of ten nanometers (10 nm) to one five hundred (500 nm). In yet other cases, predefined, latent via structures can have a minimum diameter or width in the range of ten nanometers (10 nm) to two hundred (200 nm). In yet other cases, predefined, latent via structures can have a minimum diameter or width in the range of ten nanometers (10 nm) to one hundred (100 nm). As another example, a though hole via etched from only one surface of the transparent substrate results in a through hole having an opening at the surface from which the etch is performed that is larger than the opening at the opposite surface.

Figure 5F:
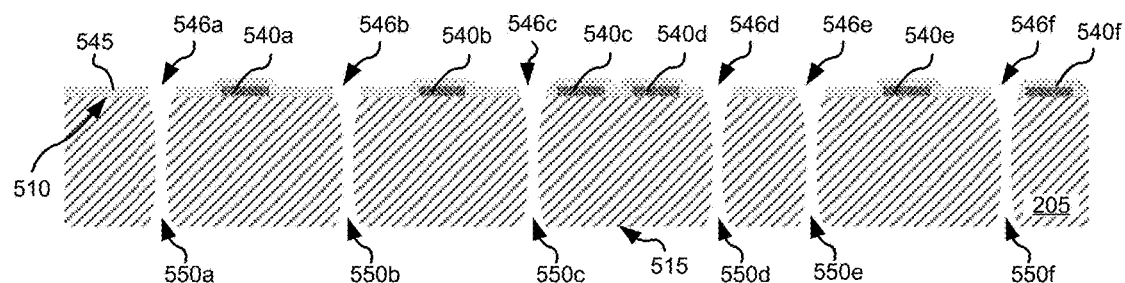

Turning to FIG. 5F, transparent substrate 505 is shown after the etching process with vias 550a-f extending from first surface 510 to second surface 515. Where the footprint of the defined paths 530a-f through transparent substrate 505 are substantially the same at both first surface 510 and second surface 515 and etching is done from both sides (i.e., both first surface 510 and second surface 515 of transparent substrate 505 are in contact with the etchant), the formed vias 550a-f exhibit an hourglass shape wider near first surface 510 and second surface 515, and narrower in the center region. Turning to FIG. 3d, a side view photograph is shown of a substrate after etching from both sides to yield hour glass shaped vias drilling resulting in defined paths extending through the substrate consistent with that described above in relation to FIG. 4. FIG. 3e is a photograph of a top surface of a transparent substrate showing a top of an etched via that measures about forty micrometers (40 µm) in diameter.

Figure 5G:
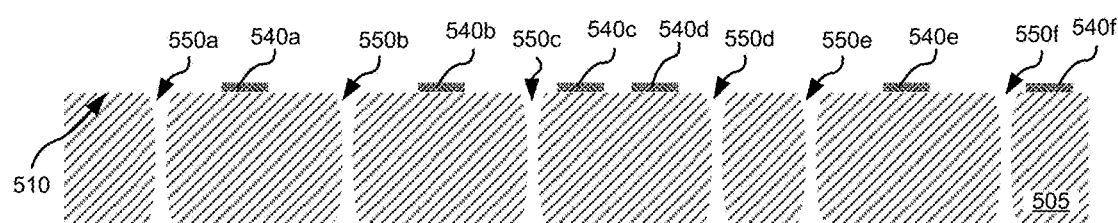

Continuing with flow diagram 400 of FIG. 4, the protective coating is removed from the surfaces of the transparent substrate and from the electronic devices (block 440). The protective coating may be fully removed exposing both the surfaces of the transparent substrate and the electronic devices or may be partially removed exposing only a subset of the surfaces of the transparent substrate and/or the electronic devices. In some particular embodiments, the protective coating is not removed until after via metalization, if ever. Turning to FIG. 5g, transparent substrate 505 is shown after the etching process with vias 550a-f extending from first surface 510 to second surface 515, and removal of all of protective coating 545.

Figure 5H:
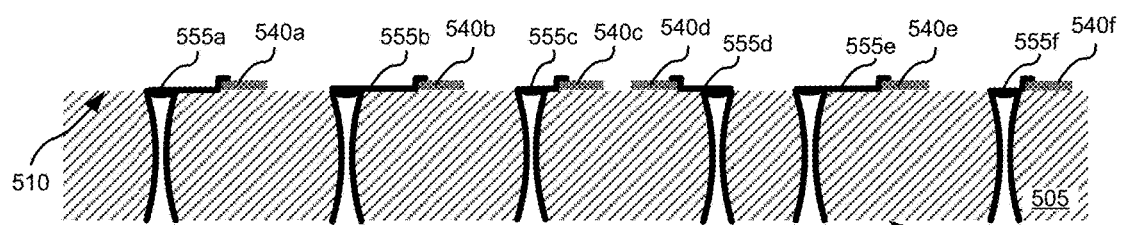

Continuing with flow diagram 400 of FIG. 4, one or more of the electronic devices are electrically connected using metal extending through one or more of the vias in the transparent substrate (block 445). In some cases, a standard metalization process is used that completely fills the vias and connects to other metal traces on the first surface and/or the second surface of the transparent substrate. In other cases, the walls of the vias are conformally coated to provide an electrical connection from the first surface to the second surface without fully filling the vias. Such a conformal coating approach is advantageous as it reduces the impact of differential expansion and contraction between the conformally coated metal and the material of the transparent substrate during thermal cycles applied in relation to forming the electronic devices and other later processes. Further, such a conformal coating approach allows for a final structure with a higher aspect ratio when compared with fully filled vias. In some cases, using conformal coating of vias allows for aspect ratios of the vias greater than three to one (3:1). In other cases, using conformal coating of vias allows for aspect ratios of the vias greater than five to one (5:1). In yet other cases using conformal coating of vias allows for aspect ratios of the vias greater than ten to one (10:1). These higher aspect ratios both enable shorter etch times and may be desirable for placing a denser array of electronic devices on an area of the surface of the transparent substrate. In some cases, finalized vias may exhibit a diameter at the narrowest, widest, or both locations in the range of five micrometers (5 µm) to five hundred micrometers (500 µm). In some cases, finalized vias may exhibit a diameter at the narrowest, widest, or both locations in the range of ten micrometers (10 µm) to two hundred micrometers (200 µm). In yet other cases, finalized vias may exhibit a diameter at the narrowest, widest, or both locations in the range of ten micrometers (10 µm) to one hundred micrometers (100 µm). In yet other cases, finalized vias may exhibit a diameter at the narrowest, widest, or both locations in the range of ten micrometers (10 µm) to fifty micrometers (50 µm). Turning to FIG. 5h, vias 550a-f through transparent substrate 515 are shown after conformal coating with a metal and formation of metal traces 555 extending from vias 550a-f to electronic devices 540a-e. Turning to FIG. 3f, a top view photograph of an electronic system including a transparent substrate, electronic devices, and fully formed vias manufactured in accordance with processes discussed above in relation to FIG. 4 is shown.

Figure 6:
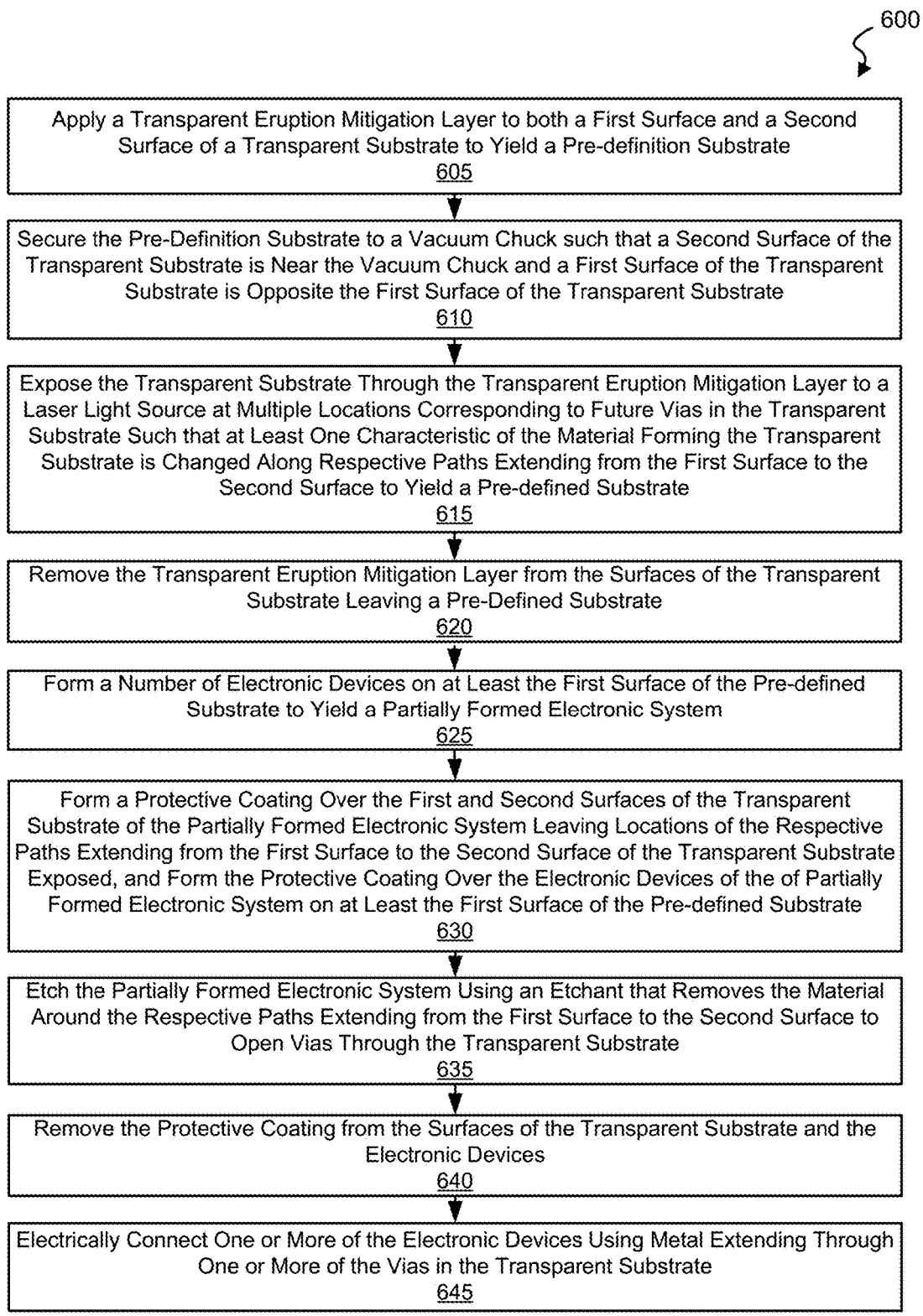
FIG. 6 is a flow diagram showing a method for manufacturing transparent substrate systems including use of protective layers on opposing surfaces of a glass substrate during laser exposure and etch in accordance with some embodiments.
Figure 7A:
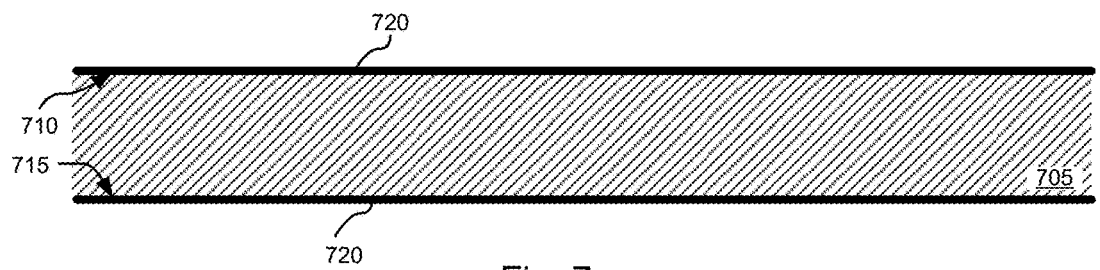
FIGS. 7a-7j show a subset of processing steps in accordance with one or more embodiments consistent with the method shown in FIG. 6.

Turning to FIG. 6, a flow diagram 600 shows a method for manufacturing transparent substrate systems including use of protective coatings on opposing surfaces of a transparent substrate during laser exposure and etch in accordance with some embodiments. Following flow diagram 600, a transparent eruption mitigation layer is applied to both a first surface of a transparent substrate and a second surface (opposite the first surface) of the transparent substrate to yield a pre-definition substrate (block 605). It has been found that placing the transparent eruption mitigation layer on an upper surface (laser incident surface) and lower surface (laser exit surface) of the transparent substrate prior to exposing the transparent substrate to photonic energy used during, for example, quasi-non-diffracting drilling (e.g., Gauss-Bessel or Bessel beam drilling) substantially reduces the height of a crater at the surfaces of the transparent substrate that surrounds the location where the via is to be formed. The transparent eruption mitigation layer and the transparent substrate may be similar to those discussed above. Turning to FIG. 7a, one example is shown of a process of applying a transparent eruption mitigation layer 720 to both a first surface 710 and a second surface 715 of a transparent substrate 705.

Figure 7B:
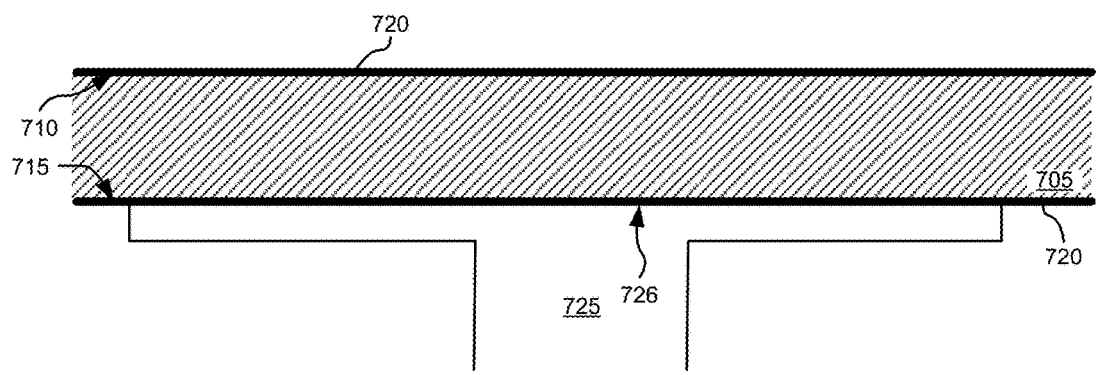

Continuing with flow diagram 600 of FIG. 6, the pre-definition substrate is attached to a vacuum chuck to hold it in place during various processing steps (block 610). Use of a vacuum chuck is possible because of the delay in etching vias until after formation of electronic devices on the surface of the transparent substrate. Turning to FIG. 7b, one example of a process of attaching a transparent substrate 705 to a vacuum chuck 725 is shown. Second surface 715 of transparent substrate 705 is placed near an upper surface 726 of vacuum chuck 725, and first surface 710 of substrate 705 is away from vacuum chuck.

Continuing with flow diagram 600 of FIG. 6, the transparent substrate is exposed to photonic energy from a laser light source at multiple locations corresponding to future vias in the transparent substrate (block 615). This exposure to the photonic energy changes at least one characteristic of the transparent substrate along respective paths extending from the first surface of the transparent substrate to the second surface of the transparent substrate. In some embodiments, the laser light source is from a laser capable of quasi-non-diffracting drilling (Gauss-Bessel or Bessel beam drilling). In some cases, the characteristic of the transparent substrate that is changed by exposure to the laser light source is density. By changing, for example, the density of the material along a defined path from the first surface of the transparent substrate to a second surface of the transparent substrate, the transparent substrate is made more susceptible to etching relative to other areas of the substrate. In some cases, an etch ratio of 9:1 (i.e., a rate of etch of the defined path is nine times greater than the rate of etch for areas of the transparent substrate surrounding the defined paths) is achieved. As the transparent substrate is sufficiently transparent to allow photonic energy from the laser light source to pass through, the change in characteristic of the transparent substrate along the paths is substantially uniform from the first surface to the second surface of the transparent substrate. In some cases, the aforementioned defined paths are compatible with thermal cycles and process conditions used for fabricating electronic devices disposed over the transparent substrate. In particular cases, to be compatible with both LTPS and oxide TFT fabrication, some embodiments can combine via pre-definition with a low-compaction transparent substrate such as Lotus NXT. Based upon the disclosure provided herein, one of ordinary skill in the art will recognize other materials from which the transparent substrate may be formed that will provide compatibility between forming the predefined paths and later electronic device formation.

In some cases, mechanical surface strength of the transparent substrate with via pre-definition sites can be higher than that of: 1) substrates with fully formed vias, and 2) substrates with fully formed and metalized vias. The substrate with predefined via locations can have a surface strength with less than fifty percent (50%) difference from a TFT compatible reference sheet of similar thickness with no predefined via locations. In particular cases, the substrate with predefined via locations can have a surface strength with less than thirty percent (30%) difference from a TFT compatible reference sheet of similar thickness with no predefined via locations. In more particular cases, the substrate with predefined via locations can have a surface strength with less than ten percent (10%) difference from a TFT compatible reference sheet of similar thickness with no predefined via locations. In yet more particular cases, the substrate with predefined via locations can have a surface strength with less than five percent (5%) difference from a TFT compatible reference sheet of similar thickness with no predefined via locations.

In some cases, the defined paths through the transparent substrate created by exposure to the laser light are less than ten micrometers (10 µm) in diameter. In more particular cases, the defined paths created by exposure to the laser light are less than five micrometers (5 μm) in diameter. In yet more particular cases, the defined paths created by exposure to the laser light are less than two micrometers (2 μm) in diameter. In some cases, a crater like feature occurring at the first surface (i.e., the laser incident surface) of the transparent substrate at a via location is less than ten micrometers (10 μm) in diameter. In more particular cases, a crater like feature occurring at the first surface (i.e., the laser incident surface) of the transparent substrate at a via location is less than five micrometers (5 μm) in diameter. In various cases, a crater like feature occurring at the second surface (i.e., the laser exit surface) of the transparent substrate at a via location is less than ten micrometers (10 μm) in diameter. In more particular cases, a crater like feature occurring at the second surface (i.e., the laser exit surface) of the transparent substrate at a via location is less than five micrometers (5 μm) in diameter. In some cases, a crater like features occurring at the first surface has a diameter that is substantially the same as that of a crater like features occurring at the second surface. In some cases, the difference in diameter of a crater like feature in the first surface and a crater like feature in the second surface is less than two micrometers (2 μm). Use of the transparent eruption mitigation layer reduces the height of the crater like features extending from the first surface of the transparent substrate when compared with non-covered transparent substrates. In some cases, the height of the crater like features extending from the first surface of the transparent substrate is reduced between one thousand, five hundred nanometers (1500 nm) peak to valley and eight hundred nanometers (800 nm) peak to valley when the transparent eruption mitigation layer is a YY-100 coating. While this embodiment discusses covering only the first surface of the transparent substrate with a transparent eruption mitigation layer, other embodiments may include covering both the first surface and the second surface of the transparent substrate. Based upon the disclosure provided herein, one of ordinary skill in the art will recognize a variety of laser light sources that may be used in relation to different embodiments.

Figure 7C:
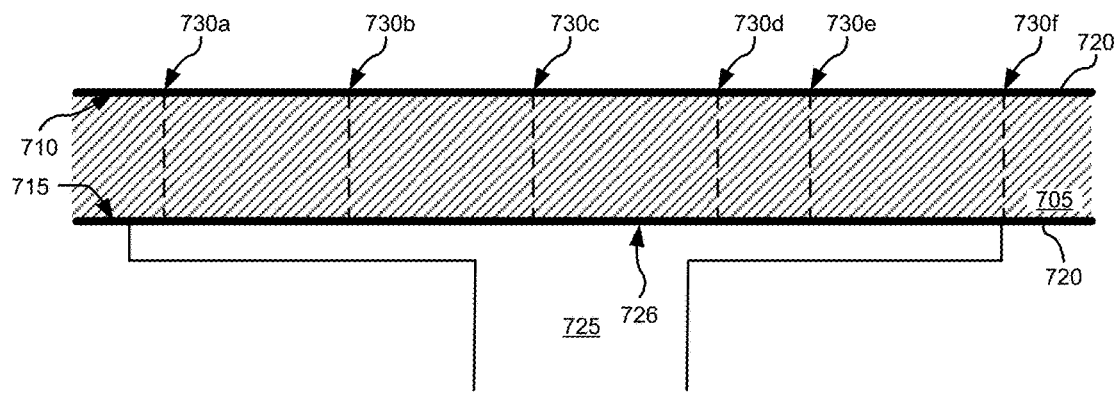

Turning to FIG. 7c, one example of a process of exposing the transparent substrate to photonic energy from a laser light source is shown. In particular, exposure to the photonic energy results in defined paths 730a-f (shown as dashed lines) extending from first surface 710 of transparent substrate 705 to second surface 715 of transparent substrate 705. Turning to FIG. 3a, a side view photograph of a transparent substrate after quasi-non-diffracting drilling resulting in defined paths extending through the substrate consistent with that described above in relation to FIG. 6 is shown. FIG. 3b is a photograph of a top surface of a transparent substrate showing a top of a defined path that measures three micrometers (3 μm) in diameter.

Figure 7D:
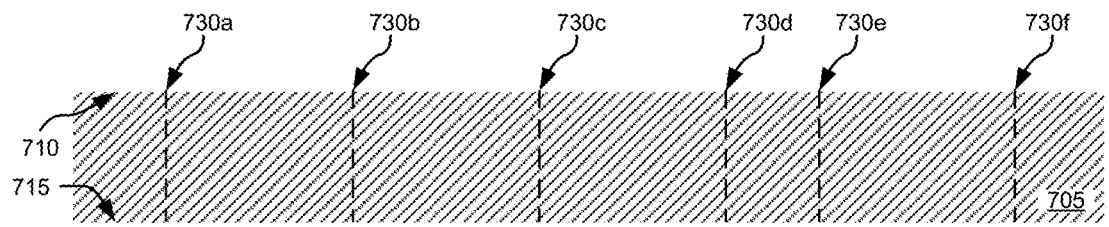

Continuing with flow diagram 600 of FIG. 6, the transparent eruption mitigation layer is removed from the transparent substrate leaving a predefined substrate (block 620). Where the transparent eruption mitigation layer was non-adhesively applied to the transparent substrate, removal is done by pulling it away from the glass substrate. Alternatively, where the transparent eruption mitigation layer was adhesively applied to the transparent substrate, removal may include both pulling it away from the transparent substrate and cleaning the transparent substrate to remove any adhesive residue. As yet another example, where the transparent eruption mitigation layer was deposited on the transparent substrate using, for example, some form of chemical vapor deposition, removal may include stripping the deposited transparent eruption mitigation layer from the glass substrate using either a polishing process or a chemical washing process. Based upon the disclosure provided herein, one of ordinary skill in the art will recognize various approaches for removing the transparent eruption mitigation layer that may be used in relation to different embodiments. Turning to FIG. 7d, one example of a predefined substrate is shown after removal of the transparent eruption mitigation layer 720 where all that remains is transparent substrate 705 having defined paths 730a-f (shown as dashed lines) extending from first surface 710 to second surface 715.

Figure 7E:
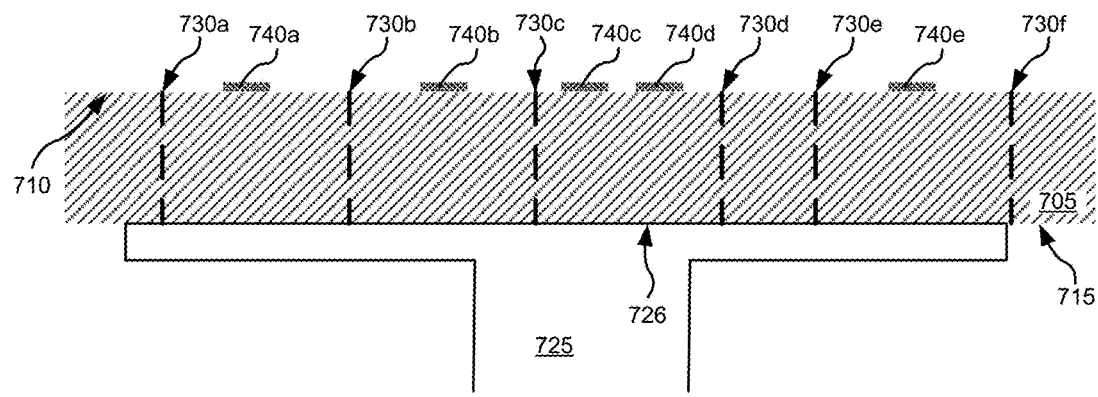

Continuing with flow diagram 600 of FIG. 6, a number of electronic devices are formed on at least one surface of the predefined substrate to yield a partially formed electronic system (block 425). The electronic devices may be fully formed in this process, or may be only partially formed. In some cases where the electronic devices are only partially formed, the portion of the electronic device formed prior to etching the vias is sensitive to the surface quality of the transparent substrate, and other portions that are not as sensitive to the quality of the surface of the transparent substrate can be completed after the vias are fully formed. An integrated device, module, or system can utilize via structures as an electrical, optical, fluidic, and/or mechanical element. The electronic devices may be similar to those discussed above in relation to FIG. 1. Turning to FIG. 7e, one example of a partially formed electronic system is shown after formation of electronic devices 740a-e on first surface 710 of transparent substrate 705.

Continuing with flow diagram 600 of FIG. 6, a protective coating is formed over the first surface and the second surface of the transparent substrate (block 630). This protective coating may be patterned to form an etch mask exposing the locations where vias have been predefined and covering other areas. Thus, when the surfaces of the transparent substrate are exposed to an etchant, both the surfaces of the transparent substrate and the electronic devices formed thereon are protected by the protective coating, while the etchant is in contact with exposed areas of the transparent substrate surfaces corresponding to the defined paths discussed above are etched.

In some embodiments, the use of an etch mask may result in a characteristic step feature in the substrate near the via locations or locations of mask openings. The magnitude of this step depends on the etch selectivity of the etch mask and the substrate. The etch mask material, deposition, and patterning processes may be selected to maximize its durability in the via formation process. Any delamination or etching of the etch mask should be minimized, and the etch mask should remain adhered to the substrate after removal of a desired amount of the substrate material. In one example, the combination of the material for the etch mask and the etchant are selected to allow for etching a via greater than fifty micrometers (50 μm) in depth. In a more particular example, the combination of the material for the etch mask and the etchant are selected to allow for etching a via greater than one hundred micrometers (100 μm) in depth. In a yet more particular example, the combination of the material for the etch mask and the etchant are selected to allow for etching a via greater than two hundred micrometers (200 μm) in depth. In a yet more particular example, the combination of the material for the etch mask and the etchant are selected to allow for etching a via greater than five hundred micrometers (500 μm) in depth. In yet more particular example, the combination of the material for the etch mask and the etchant are selected to allow for etching a via greater than one thousand micrometers (1000 μm) in depth. Any coating capable of protecting surfaces of the substrate and the electronic devices may be used. As one particular embodiment, the protective coating is chromium oxynitride (CrON). In one particular embodiment, a one hundred, eighty nanometer (180 nm) thick layer of chromium oxynitride is formed over areas not intended to be etched. This protective coating will protect the surfaces of the transparent substrate the electronic while vias extending two hundred micrometers (200 μm) from the first surface of the transparent substrate to the second surface of the transparent substrate using hydrofluoric acid (HF) are etched.

In some cases, the protective coating may maintain adhesion to the substrate during via etching depths in the range of 50 μm to 1500 μm. In more particular cases, the protective coating may maintain adhesion to the substrate during via etching depths in the range of 100 μm to 700 μm. In other cases, the protective coating may maintain adhesion to the substrate during via etching depths in the range of 300 μm to 500 μm. Patterning of the etch mask around the via location enables via etching from both substrate major surfaces. In some cases, the edge of the protective coating is placed less than five hundred micrometers (500 μm) away from the paths defined during the pre-definition process discussed above in relation to block 615. In more particular cases, the edge of the protective coating is placed less than two hundred micrometers (200 μm) away from the paths defined during the pre-definition process discussed above in relation to block 615. In yet more particular cases, the edge of the protective coating is placed less than one hundred micrometers (100 μm) away from the paths defined during the pre-definition process discussed above in relation to block 615. In yet more particular cases, the edge of the protective coating is placed less than fifty micrometers (50 μm) away from the paths defined during the pre-definition process discussed above in relation to block 615. In yet more particular cases, the edge of the protective coating is placed less than twenty micrometers (20 μm) away from the paths defined during the pre-definition process discussed above in relation to block 615. In yet more particular cases, the edge of the protective coating is placed less than ten micrometers (10 μm) away from the paths defined during the pre-definition process discussed above in relation to block 615. In yet more particular cases, the edge of the protective coating is placed less than five micrometers (5 μm) away from the paths defined during the pre-definition process discussed above in relation to block 615.

In some cases, the openings in the protective coating may range in distance from five micrometers (5 μm) to five hundred micrometers (500 μm) away from the paths defined during the pre-definition process discussed above in relation to block 615. In more particular cases, the openings in the protective coating may range in distance from ten micrometers (10 μm) to two hundred micrometers (200 μm) away from the paths defined during the pre-definition process discussed above in relation to block 615. In yet more particular cases, the openings in the protective coating may range in distance from fifty micrometers (50 μm) to two hundred micrometers (200 μm) away from the paths defined during the pre-definition process discussed above in relation to block 615.

Figure 7F:
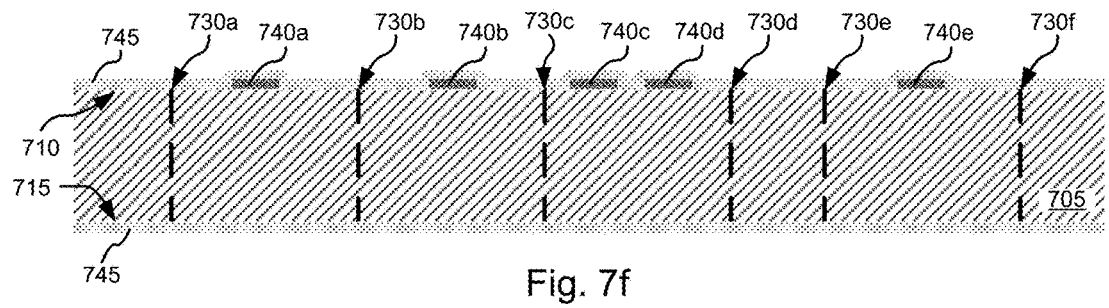
Figure 7G:
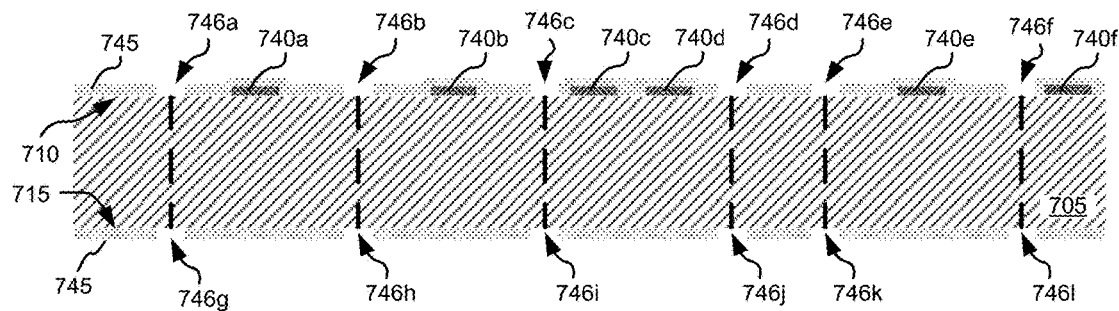

Turning to FIG. 7*f*, one example of a partially formed electronic system is shown with a protective coating 745 formed over electronic devices 740*a*-*e* on first surface 710 and second surface 715 of transparent substrate 705. Turning to FIG. 7*g*, protective coating 745 is shown after a pattern and etch exposes first surface 710 of transparent substrate 705 at locations 746 corresponding to defined paths 730*a*-*f*.

Continuing with flow diagram 600 of FIG. 6, the partially formed electronic system is etched using an etchant that removes the material changed along the respective paths extending from the first surface of the transparent substrate to the second surface of the transparent substrate at a much higher rate than other materials are removed (block 635). This etching process is continued until vias extending through the transparent substrate are opened at each of the respective paths through the transparent substrate.

While the embodiment of FIG. 6 is discussed as resulting in vias etched from both sides and resulting in an hourglass shaped opening extending from the first surface to the second surface, other types of vias a possible by changing the etch process. For example, blind vias may be formed by etching only from one surface for a period that is insufficient to make an opening extending from the first surface to the second surface. Such blind vias may extend most of the way through the transparent substrate (e.g., leaving an un-etched portion extending from the surface opposite that to which the etchant is applied of less than five micrometers (5 μm)). The advantage of such an approach is that one surface (i.e., the surface opposite that to which the etchants is applied) remains untouched or undamaged by exposure to the etchant. In this manner, the through-hole via location can be predefined by a blind-via structure, and subsequently finished only after the pristine nature of the un-etched surface is no longer needed. The vias can also be predefined as a pilot hole with a minimum opening of less than ten micrometers (10 μm). In other cases, the predefined pilot hole exhibits a minimum opening of less than five micrometers (5 μm). In yet other cases, the predefined pilot hole exhibits a minimum opening of less than one micrometer (1 μm). In yet more particular cases, the predefined pilot hole exhibits a minimum opening of less than one half of a micrometer (0.5 μm). In some cases, predefined, latent via structures can have a minimum diameter or width in the range of ten nanometers (10 nm) to ten thousand nanometers (10,000 nm). In other cases, predefined, latent via structures can have a minimum diameter or width in the range of ten nanometers (10 nm) to one thousand nanometers (1000 nm). In yet other cases, predefined, latent via structures can have a minimum diameter or width in the range of ten nanometers (10 nm) to one five hundred (500 nm). In yet other cases, predefined, latent via structures can have a minimum diameter or width in the range of ten nanometers (10 nm) to two hundred (200 nm). In yet other cases, predefined, latent via structures can have a minimum diameter or width in the range of ten nanometers (10 nm) to one hundred (100 nm). As another example, a though hole via etched from only one surface of the transparent substrate results in a through hole having an opening at the surface from which the etch is performed that is larger than the opening at the opposite surface.

Figure 7H:
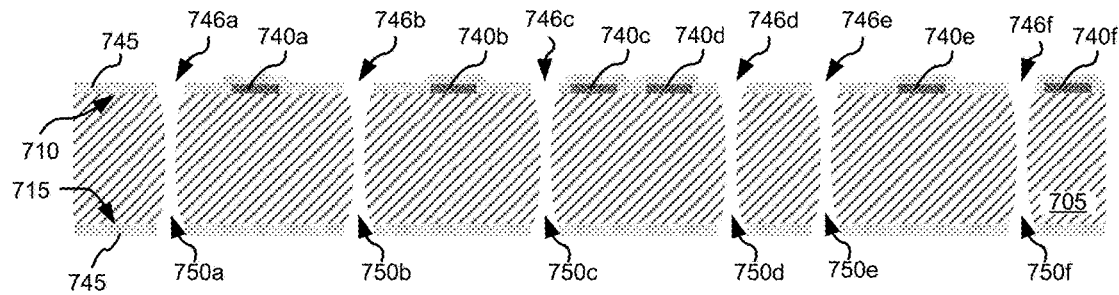

Turning to FIG. 7*h*, transparent substrate 705 is shown after the etching process with vias 750*a*-*f* extending from first surface 710 to second surface 715. Where the footprint of the defined paths 730*a*-*f* through transparent substrate 705 are substantially the same at both first surface 710 and second surface 715 and etching is done from both sides (i.e., both first surface 710 and second surface 715 of transparent substrate 705 are in contact with the etchant), the formed vias 750*a*-*f* exhibit an hourglass shape wider near first surface 710 and second surface 715, and narrower in the center region. Turning to FIG. 3*d*, a side view photograph of a substrate after etching from both sides to yield hour glass shaped vias drilling resulting in defined paths extending through the substrate consistent with that described above in relation to FIG. 6 is shown. FIG. 3*e* is a photograph of a top surface of a transparent substrate showing a top of an etched via that measures about forty micrometers (40 µm) in diameter.

Figure 7I:
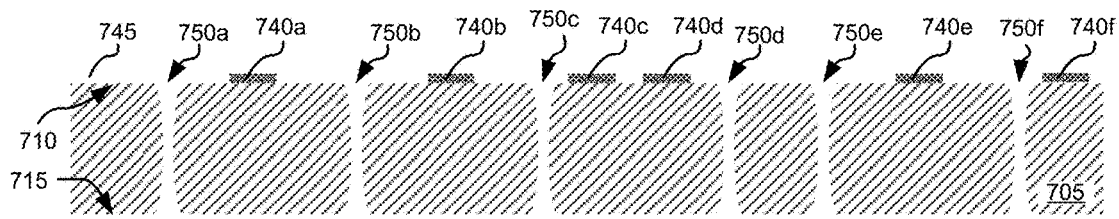

Continuing with flow diagram 600 of FIG. 6, the protective coating is removed from the surfaces of the transparent substrate and from the electronic devices (block 640). The protective coating may be fully removed exposing both the surfaces of the transparent substrate and the electronic devices or may be partially removed exposing only a subset of the surfaces of the transparent substrate and/or the electronic devices. In some particular embodiments, the protective coating is not removed until after via metalization, if ever. Turning to FIG. 7i, transparent substrate 705 is shown after the etching process with vias 750a-f extending from first surface 710 to second surface 715, and removal of all of protective coating 745.

Continuing with flow diagram 600 of FIG. 6, one or more of the electronic devices are electrically connected using metal extending through one or more of the vias in the transparent substrate (block 645). In some cases, a standard metalization process is used that completely fills the vias and connects to other metal traces on the first surface and/or the second surface of the transparent substrate. In other cases, the walls of the vias are conformally coated to provide an electrical connection from the first surface to the second surface without fully filling the vias. Such a conformal coating approach is advantageous as it reduces the impact of differential expansion and contraction between the conformally coated metal and the material of the transparent substrate during thermal cycles applied in relation to forming the electronic devices and other later processes. Further, such a conformal coating approach allows for a final structure with a higher aspect ratio when compared with fully filled vias. In some cases using conformal coating of vias allows for aspect ratios of the vias greater than three to one (3:1). In other cases using conformal coating of vias allows for aspect ratios of the vias greater than five to one (5:1).

Figure 7J:
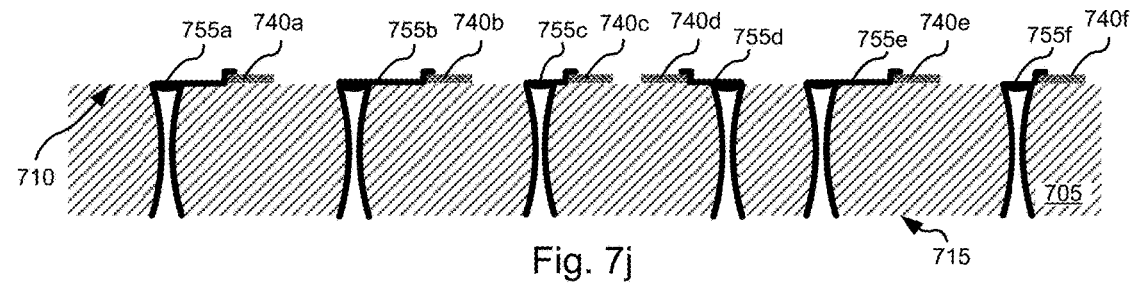

In yet other cases using conformal coating of vias allows for aspect ratios of the vias greater than ten to one (10:1). These higher aspect ratios both enable shorter etch times and may be desirable for placing a denser array of electronic devices on an area of the surface of the transparent substrate. In some cases, finalized vias may exhibit a diameter at the narrowest, widest, or both locations in the range of five micrometers (5 µm) to five hundred micrometers (500 µm). In some cases, finalized vias may exhibit a diameter at the narrowest, widest, or both locations in the range of ten micrometers (10 µm) to two hundred micrometers (200 µm). In yet other cases, finalized vias may exhibit a diameter at the narrowest, widest, or both locations in the range of ten micrometers (10 µm) to one hundred micrometers (100 µm). In yet other cases, finalized vias may exhibit a diameter at the narrowest, widest, or both locations in the range of ten micrometers (10 µm) to fifty micrometers (50 µm). Turning to FIG. 7j, vias 750a-f through transparent substrate 715 are shown after conformal coating with a metal and formation of metal traces 755 extending from vias 750a-f to electronic devices 740a-e. Turning to FIG. 3f, a top view photograph of an electronic system including a transparent substrate, electronic devices, and fully formed vias manufactured in accordance with processes discussed above in relation to FIG. 6 is shown.

Figure 8:
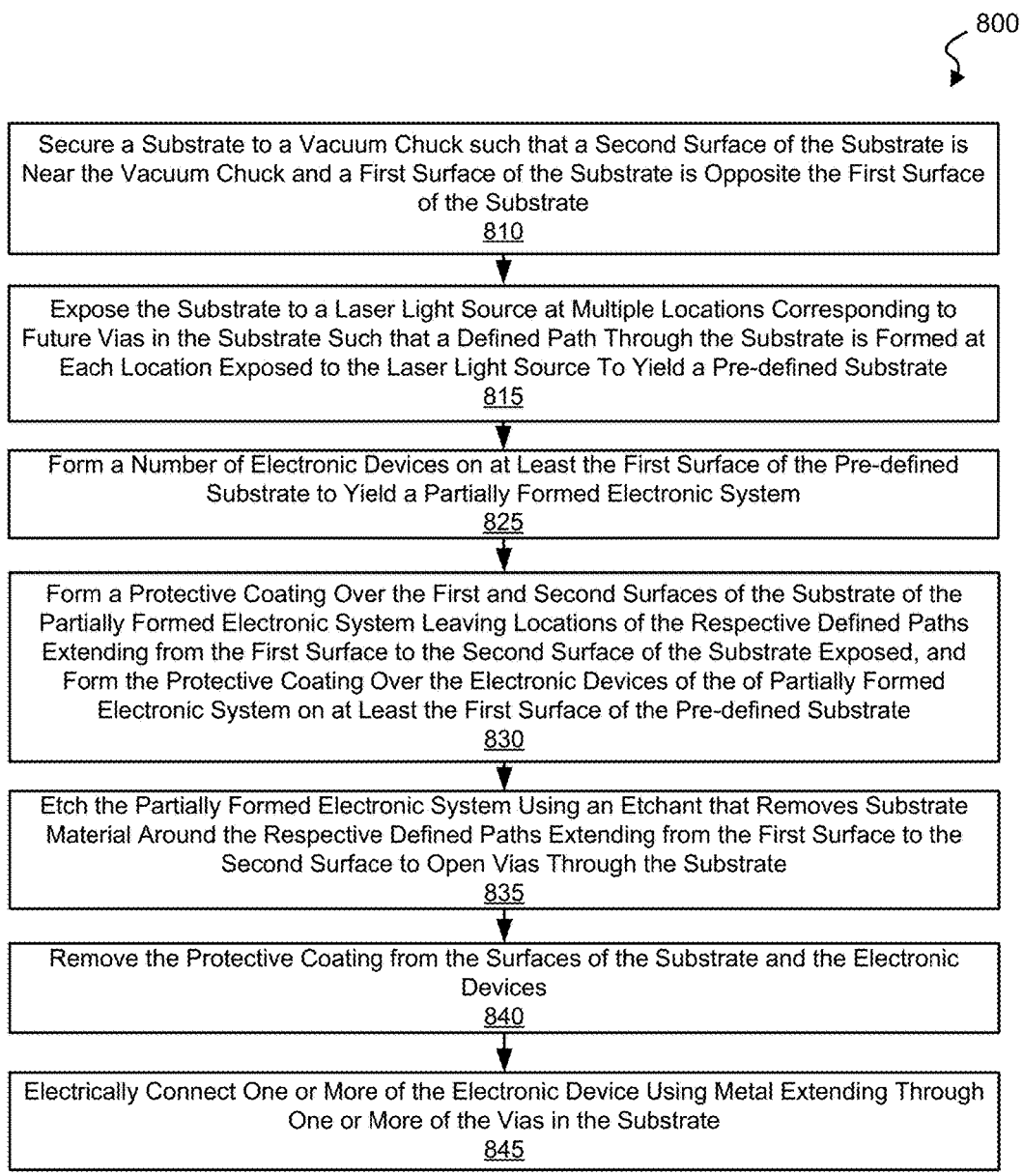
FIG. 8 is a flow diagram showing a method for manufacturing substrate systems that does not utilize a protective layer during laser exposure of the transparent substrate in accordance with various embodiments.
Figure 9A:
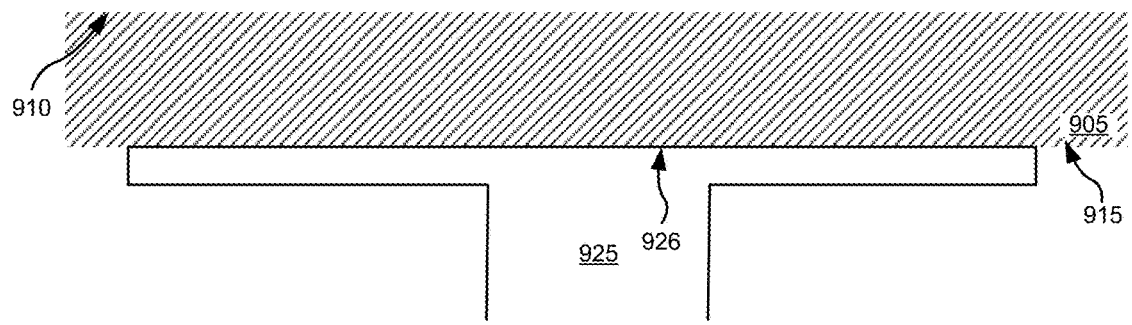
FIGS. 9a-9h show a subset of processing steps in accordance with one or more embodiments consistent with the method shown in FIG. 8.

Turning to FIG. 8, a flow diagram 800 shows a method for manufacturing substrate systems that does not utilize a protective layer during laser exposure of the substrate in accordance with various embodiments. Following flow diagram 800, a substrate is attached to a vacuum chuck to hold it in place during various processing steps (block 810). Use of a vacuum chuck is possible because of the delay in etching vias until after formation of electronic devices on the surface of the transparent substrate. An example attribute of the substrate is the ability to support predefined vias in the substrate and then support fully formation of vias at locations corresponding to the predefined vias after intermediate processes of forming electronic devices on the substrate. Turning to FIG. 9a, one example of a process of attaching a transparent substrate 905 to a vacuum chuck 925 is shown. Second surface 915 of transparent substrate 905 is placed near an upper surface 926 of vacuum chuck 925, and first surface 910 of substrate 905 is away from vacuum chuck 925.

Continuing with flow diagram 800 of FIG. 8, the substrate is exposed to photonic energy from a laser light source at multiple locations corresponding to future vias in the substrate such that a defined path through the substrate (block 815). In some cases, exposure to the laser light source results in percussive drilling using a Gaussian beam. Use of percussive drilling results in a tapered pilot hole that extends from the first surface of the substrate to the second surface of the substrate. The pilot hole may be, for example, between fifteen and twenty micrometers (15-20 µm) at the surface closet to the laser (i.e., the incident or entrance side). At the opposite surface away from the laser (i.e., the exit side), the diameter of the pilot hole is, for example, five to eight micrometers (5-8 µm). Because of the tapering of the pilot holes, the finally formed vias are either tapered where etching is performed only from the incident surface, and a modified hourglass shape when the etching is performed from both the entrance and exit surfaces. Where percussive drilling is used, the substrate does not need to be a substrate, but rather only needs to be made of either a transparent or opaque material that is susceptible to the percussive drilling. In some cases, the surfaces of the substrate are not polished after exposure to the laser light source. In other cases, one or both surfaces (i.e., an incident surface and an exit surface) of the substrate is/are polished after exposure to the laser light source.

Figure 9B:
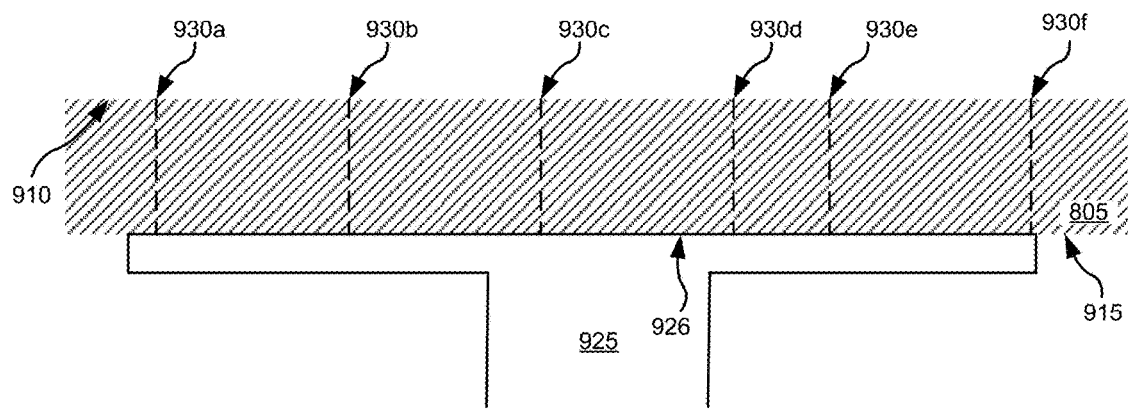

Turning to FIG. 9b, one example of a process of exposing the substrate to photonic energy from a laser light source is shown. In particular, exposure to the photonic energy results in defined paths 930a-f (shown as dashed lines) extending from first surface 910 of substrate 905 to second surface 915 of substrate 905. Turning to FIG. 3c, a side view photograph is shown of a substrate after use of percussive drilling of the substrate resulting in defined paths through the substrate.

Figure 9C:
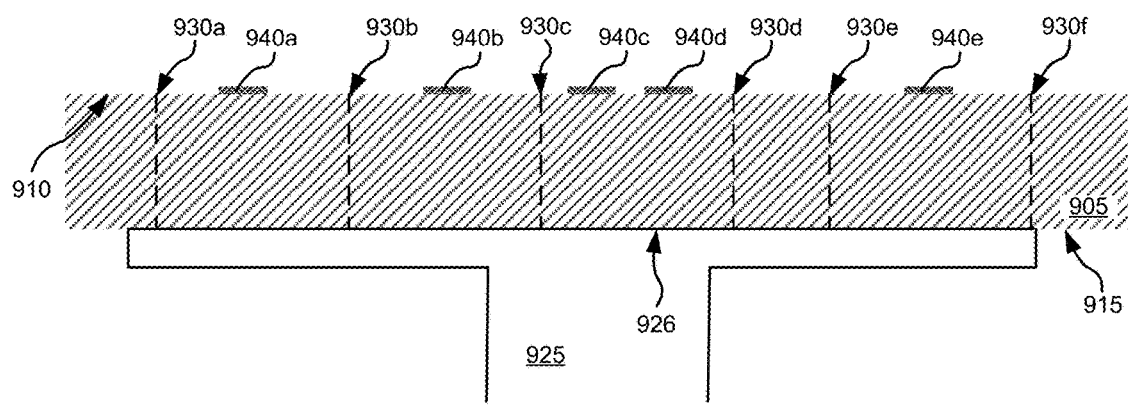

Continuing with flow diagram 800 of FIG. 8, a number of electronic devices are formed on at least one surface of the predefined substrate to yield a partially formed electronic system (block 825). The electronic devices may be fully formed in this process, or may be only partially formed. In some cases where the electronic devices are only partially formed, the portion of the electronic device formed prior to etching the vias is sensitive to the surface quality of the substrate, and other portions that are not as sensitive to the quality of the surface of the substrate can be completed after the vias are fully formed. An integrated device, module, or system can utilize via structures as an electrical, optical, fluidic, and/or mechanical element. The electronic devices may be similar to those discussed above in relation to FIG. 1. Turning to FIG. 9c, one example of a partially formed electronic system is shown after formation of electronic devices 940a-e on first surface 910 of substrate 905.

Continuing with flow diagram 800 of FIG. 8, a protective coating is formed over the first surface and the second surface of the substrate (block 830). This protective coating may be patterned to form an etch mask exposing the locations where vias have been predefined and covering other areas. Thus, when the surfaces of the substrate are exposed to an etchant, both the surfaces of the substrate and the electronic devices formed thereon are protected by the protective coating, while the etchant is in contact with exposed areas of the substrate surfaces corresponding to the defined paths discussed above are etched.

In some embodiments, the use of an etch mask may result in a characteristic step feature in the substrate near the via locations or locations of mask openings. The magnitude of this step depends on the etch selectivity of the etch mask and the substrate. The etch mask material, deposition, and patterning processes may be selected to maximize its durability in the via formation process. Any delamination or etching of the etch mask should be minimized, and the etch mask should remain adhered to the substrate after removal of a desired amount of the substrate material. In one example, the combination of the material for the etch mask and the etchant are selected to allow for etching a via greater than fifty micrometers (50 μm) in depth. In a more particular example, the combination of the material for the etch mask and the etchant are selected to allow for etching a via greater than one hundred micrometers (100 μm) in depth. In a yet more particular example, the combination of the material for the etch mask and the etchant are selected to allow for etching a via greater than two hundred micrometers (200 μm) in depth. In a yet more particular example, the combination of the material for the etch mask and the etchant are selected to allow for etching a via greater than five hundred micrometers (500 μm) in depth. In yet more particular example, the combination of the material for the etch mask and the etchant are selected to allow for etching a via greater than one thousand micrometers (1000 μm) in depth. Any coating capable of protecting surfaces of the substrate and the electronic devices may be used. As one particular embodiment, the protective coating is chromium oxynitride (CrON). In one particular embodiment, a one hundred, eighty nanometer (180 nm) thick layer of chromium oxynitride is formed over areas not intended to be etched. This protective coating will protect the surfaces of the substrate the electronic while vias extending two hundred micrometers (200 μm) from the first surface of the substrate to the second surface of the substrate using hydrofluoric acid (HF) are etched.

In some cases, the protective coating may maintain adhesion to the substrate during via etching depths in the range of 90 μm to 1500 μm. In more particular cases, the protective coating may maintain adhesion to the substrate during via etching depths in the range of 100 μm to 700 μm. In other cases, the protective coating may maintain adhesion to the substrate during via etching depths in the range of 300 μm to 900 μm. Patterning of the etch mask around the via location enables via etching from both substrate major surfaces. In some cases, the edge of the protective coating is placed less than five hundred micrometers (500 μm) away from the paths defined during the pre-definition process discussed above in relation to block 815. In more particular cases, the edge of the protective coating is placed less than two hundred micrometers (200 μm) away from the paths defined during the pre-definition process discussed above in relation to block 815. In yet more particular cases, the edge of the protective coating is placed less than one hundred micrometers (100 μm) away from the paths defined during the pre-definition process discussed above in relation to block 815. In yet more particular cases, the edge of the protective coating is placed less than fifty micrometers (50 μm) away from the paths defined during the pre-definition process discussed above in relation to block 815. In yet more particular cases, the edge of the protective coating is placed less than twenty micrometers (20 μm) away from the paths defined during the pre-definition process discussed above in relation to block 815. In yet more particular cases, the edge of the protective coating is placed less than ten micrometers (10 μm) away from the paths defined during the pre-definition process discussed above in relation to block 815. In yet more particular cases, the edge of the protective coating is placed less than five micrometers (5 μm) away from the paths defined during the pre-definition process discussed above in relation to block 815.

In some cases, the openings in the protective coating may range in distance from five micrometers (5 μm) to five hundred micrometers (500 μm) away from the paths defined during the pre-definition process discussed above in relation to block 815. In more particular cases, the openings in the protective coating may range in distance from ten micrometers (10 μm) to two hundred micrometers (200 μm) away from the paths defined during the pre-definition process discussed above in relation to block 815. In yet more particular cases, the openings in the protective coating may range in distance from fifty micrometers (50 μm) to two hundred micrometers (200 μm) away from the paths defined during the pre-definition process discussed above in relation to block 815.

Figure 9D:
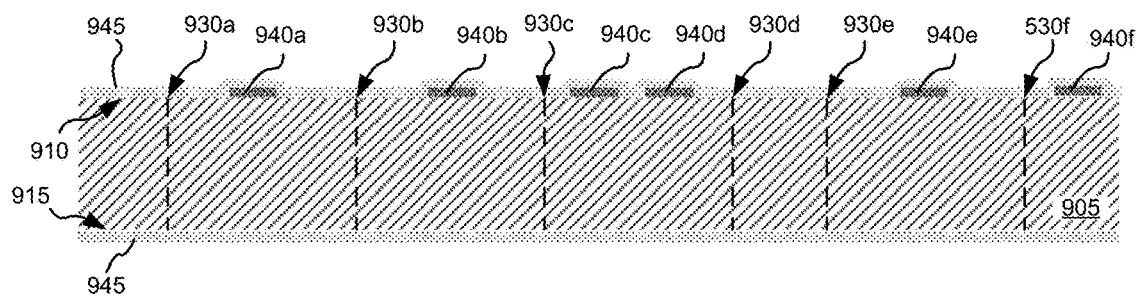
Figure 9E:
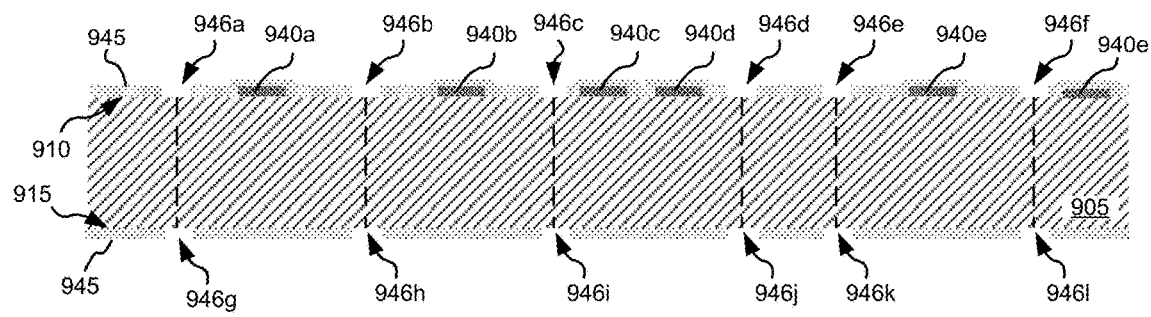

Turning to FIG. 9*d*, one example of a partially formed electronic system is shown with a protective coating 945 formed over electronic devices 940*a-e* on first surface 910 and second surface 915 of transparent substrate 905. Turning to FIG. 9*e*, protective coating 945 is shown after a pattern and etch exposes first surface 910 and second surface 915 of transparent substrate 905 at locations 946*g-l* corresponding to defined paths 930*a-f*. While FIGS. 9*d-9e* shown protective coating 945 etched to expose both first surface 910 and second surface 915, where etching is only desired from one of first surface 910 or second surface 915, only the surface from which the etch will be performed is patterned and etch to expose locations corresponding to defined paths 930*a-f*.

Continuing with flow diagram 800 of FIG. 8, the partially formed electronic system is etched using an etchant that removes the material changed along the respective paths extending from the first surface of the substrate to the second surface of the substrate at a much higher rate than other materials are removed (block 835). This etching process is continued until vias extending through the substrate are opened at each of the respective paths through the substrate.

While the embodiment of FIG. 8 is discussed as resulting in vias etched from both sides and resulting in an hourglass shaped opening extending from the first surface to the second surface, other types of vias a possible by changing the etch process. For example, blind vias may be formed by etching only from one surface for a period that is insufficient to make an opening extending from the first surface to the second surface. Such blind vias may extend most of the way through the substrate (e.g., leaving an un-etched portion extending from the surface opposite that to which the etchant is applied of less than five micrometers (5 μm)). The advantage of such an approach is that one surface (i.e., the surface opposite that to which the etchants is applied) remains untouched or undamaged by exposure to the etchant. In this manner, the through-hole via location can be predefined by a blind-via structure, and subsequently finished only after the pristine nature of the un-etched surface is no longer needed. The vias can also be predefined as a pilot hole with a minimum opening of less than ten micrometers (10 µm). In other cases, the predefined pilot hole exhibits a minimum opening of less than five micrometers (5 µm). In yet other cases, the predefined pilot hole exhibits a minimum opening of less than one micrometer (1 µm). In yet more particular cases, the predefined pilot hole exhibits a minimum opening of less than one half of a micrometer (0.5 µm). In some cases, predefined, latent via structures can have a minimum diameter or width in the range of ten nanometers (10 nm) to ten thousand nanometers (10,000 nm). In other cases, predefined, latent via structures can have a minimum diameter or width in the range of ten nanometers (10 nm) to one thousand nanometers (1000 nm). In yet other cases, predefined, latent via structures can have a minimum diameter or width in the range of ten nanometers (10 nm) to one five hundred (500 nm). In yet other cases, predefined, latent via structures can have a minimum diameter or width in the range of ten nanometers (10 nm) to two hundred (200 nm). In yet other cases, predefined, latent via structures can have a minimum diameter or width in the range of ten nanometers (10 nm) to one hundred (100 nm). As another example, a though hole via etched from only one surface of the substrate results in a through hole having an opening at the surface from which the etch is performed that is larger than the opening at the opposite surface.

Figure 9F:
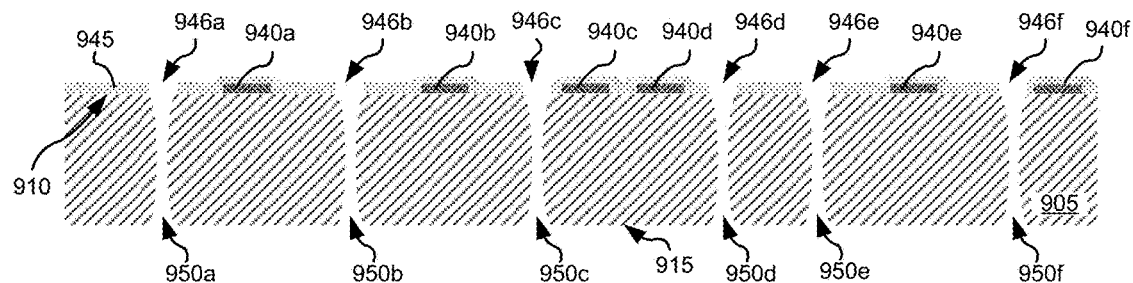

Turning to FIG. 9f, substrate 905 is shown after the etching process with vias 950a-f extending from first surface 910 to second surface 915. Where the footprint of the defined paths 930a-f through substrate 905 are substantially the same at both first surface 910 and second surface 915 and etching is done from both sides (i.e., both first surface 910 and second surface 915 of substrate 905 are in contact with the etchant), the formed vias 950a-f exhibit an hourglass shape wider near first surface 910 and second surface 915, and narrower in the center region. Turning to FIG. 3d, a side view photograph of a substrate after etching from both sides to yield hour glass shaped vias drilling resulting in defined paths extending through the substrate consistent with that described above in relation to FIG. 8 is shown. FIG. 3e is a photograph of a top surface of a transparent substrate showing a top of an etched via that measures about forty micrometers (40 µm) in diameter.

Figure 9G:
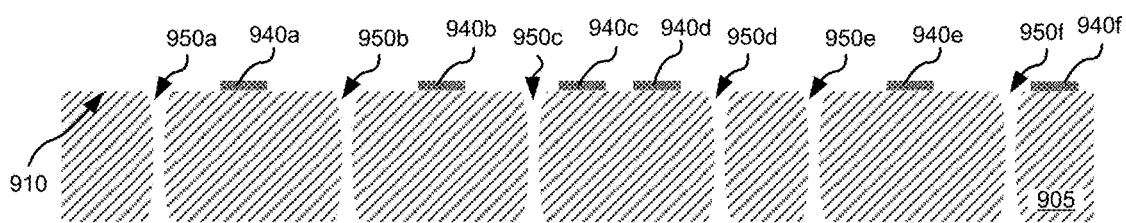

Continuing with flow diagram 800 of FIG. 8, the protective coating is removed from the surfaces of the substrate and from the electronic devices (block 840). The protective coating may be fully removed exposing both the surfaces of the substrate and the electronic devices or may be partially removed exposing only a subset of the surfaces of the substrate and/or the electronic devices. In some particular embodiments, the protective coating is not removed until after via metalization, if ever. Turning to FIG. 9g, substrate 905 is shown after the etching process with vias 950a-f extending from first surface 910 to second surface 915, and removal of all of protective coating 945.

Continuing with flow diagram 800 of FIG. 8, one or more of the electronic devices are electrically connected using metal extending through one or more of the vias in the substrate (block 845). In some cases, a standard metalization process is used that completely fills the vias and connects to other metal traces on the first surface and/or the second surface of the substrate. In other cases, the walls of the vias are conformally coated to provide an electrical connection from the first surface to the second surface without fully filling the vias. Such a conformal coating approach is advantageous as it reduces the impact of differential expansion and contraction between the conformally coated metal and the material of the substrate during thermal cycles applied in relation to forming the electronic devices and other later processes. Further, such a conformal coating approach allows for a final structure with a higher aspect ratio when compared with fully filled vias. In some cases using conformal coating of vias allows for aspect ratios of the vias greater than three to one (3:1). In other cases using conformal coating of vias allows for aspect ratios of the vias greater than five to one (5:1).

Figure 9H:
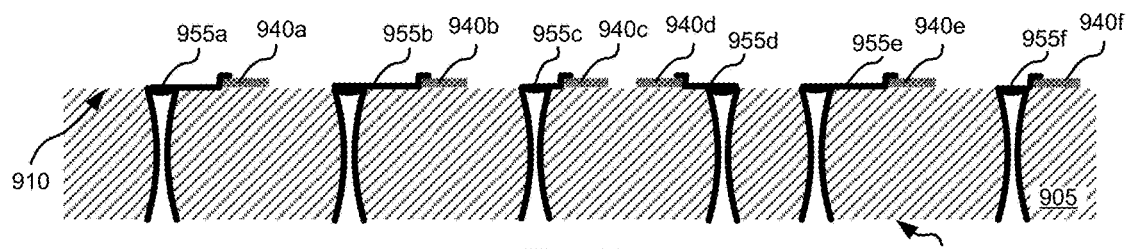

In yet other cases using conformal coating of vias allows for aspect ratios of the vias greater than ten to one (10:1). These higher aspect ratios both enable shorter etch times and may be desirable for placing a denser array of electronic devices on an area of the surface of the substrate. In some cases, finalized vias may exhibit a diameter at the narrowest, widest, or both locations in the range of five micrometers (5 µm) to five hundred micrometers (500 µm). In some cases, finalized vias may exhibit a diameter at the narrowest, widest, or both locations in the range of ten micrometers (10 µm) to two hundred micrometers (200 µm). In yet other cases, finalized vias may exhibit a diameter at the narrowest, widest, or both locations in the range of ten micrometers (10 µm) to one hundred micrometers (100 µm). In yet other cases, finalized vias may exhibit a diameter at the narrowest, widest, or both locations in the range of ten micrometers (10 µm) to fifty micrometers (50 µm). Turning to FIG. 9h, vias 950a-f through substrate 915 are shown after conformal coating with a metal and formation of metal traces 955 extending from vias 950a-f to electronic devices 940a-e. Turning to FIG. 3f, a top view photograph of an electronic system including a substrate, electronic devices, and fully formed vias manufactured in accordance with processes discussed above in relation to FIG. 8 is shown.

In conclusion, the invention provides novel systems, devices, methods and arrangements for forming substrates including vias. While detailed descriptions of one or more embodiments of the invention have been given above, various alternatives, modifications, and equivalents will be apparent to those skilled in the art without varying from the spirit of the invention. For example, other embodiments may methods including pre-definition of via locations and later full formation of vias with intervening electronic device formation processes and include elements from the disclosed embodiments interchanged to achieve a desired result. Therefore, the above description should not be taken as limiting the scope of the invention, which is defined by the appended claims.

What is claimed is:

1. A method for processing a substrate, the method comprising:
    performing a via pre-definition on a substrate, wherein the via pre-definition is done through a protective layer disposed over the substrate, and wherein at least one defined path through the substrate is created;
    forming a non-via structure on the substrate after performing the via pre-definition; and
    after forming the non-via structure on the substrate, etching the substrate such that substrate material around the predefined path is removed at a higher rate than substrate material at other locations on the substrate, wherein a via is formed at a location corresponding to the defined path.

2. The method of claim 1, wherein the substrate is a transparent substrate.

3. The method of claim 1, wherein the substrate is selected from a group consisting of: a glass substrate, a glass-ceramic substrate, and a ceramic substrate.

4. The method of claim 1, wherein the method further comprises:
applying the protective layer over the substrate prior to performing the via pre-definition.

5. The method of claim 1, wherein the protective layer comprises a sheet of material at least partially transparent to a defined wavelength of light.

6. The method of claim 4, wherein applying the protective layer over the substrate includes non-adhesively placing the protective layer on the substrate.

7. The method of claim 4, wherein applying the protective layer over the substrate includes adhesively attaching the protective layer to the substrate.

8. The method of claim 4, wherein applying the protective layer over the substrate includes depositing a protective material over at least one surface of the substrate.

9. The method of claim 1, wherein performing the via pre-definition includes non-ablative laser drilling that forms the predefined path extending from a first surface of the substrate to a second surface of the substrate.

10. The method of claim 1, wherein performing the via pre-definition includes quasi-non-diffracting drilling that forms the predefined path extending from a first surface of the substrate to a second surface of the substrate, and wherein the predefined path includes material of the substrate in which at least one characteristic has been changed compared with material of the substrate that was not exposed to the quasi-non-diffracting drilling.

11. The method of claim 10, wherein the at least one characteristic is refractive index.

12. The method of claim 10, wherein the at least one characteristic is density.

13. The method of claim 10, wherein changing the at least one characteristic make the material exposed to quasi-non-diffracting drilling etch at least two times as fast as material of the substrate that was not exposed to the quasi-non-diffracting drilling.

14. The method of claim 1, wherein performing the via pre-definition includes ablative laser drilling that forms the predefined path extending from a first surface of the substrate to a second surface of the substrate.

15. The method of claim 1, wherein performing the via pre-definition includes percussive drilling using a Gaussian beam.

16. The method of claim 1, wherein the method further comprises:
forming a protective coating over at least the non-via structure prior to etching the substrate, wherein the protective coating operates to reduce damage to the non-via structure during etching of the substrate.

17. The method of claim 16, wherein forming the protective coating further includes forming the protective coating over at least a portion of the surface of the substrate, and wherein the protective coating further operates to reduce damage to the portion of the surface of the substrate during etching of the substrate.

18. The method of claim 16, wherein the protective coating is chromium oxynitride (CrON).

19. The method of claim 16, wherein the method further comprises:
removing at least a portion of the protective coating after etching the substrate is completed.

20. The method of claim 1, wherein the method further comprises:
forming a conductive material in the via.

21. The method of claim 20, wherein forming the conductive material in the via includes conformally coating at least a portion of walls of the via with a metal.

22. The method of claim 1, wherein the non-via structure is a thin film transistor.

23. An electronic system, the system comprising:
a substrate having a plurality of vias extending from a first surface of the substrate to a second surface of the substrate, wherein each of the plurality of vias exhibit a mid-diameter half way between the first surface and the second surface of the substrate that is more than fifteen percent less than a first diameter at the first surface of the substrate or a second diameter at the second surface of the substrate;
a non-via structure formed on at least the first surface of the substrate; and
a conductive material on an inner wall of at least one of the plurality of vias, wherein a distance between edges of the conductive material at a location at least twenty-five percent of the distance from the first surface of the substrate to the second surface of the substrate is greater than zero.

24. The system of claim 23, wherein the substrate is a transparent substrate.

25. The system of claim 23, wherein the substrate is selected from a group consisting of: a glass substrate, a glass-ceramic substrate, and a ceramic substrate.

26. The system of claim 23, wherein the conductive material comprises a metal.

27. The system of claim 23, wherein an opening in the conductive material at all locations within the via exhibits a non-zero diameter.

28. The system of claim 23, wherein the mid-diameter is more than twenty percent less than the first diameter or the second diameter.

29. The system of claim 23, wherein the mid-diameter is more than thirty percent less than the first diameter or the second diameter.

30. The system of claim 23, wherein the non-via structure is more than one hundred micrometers (100 µm) and less than five hundred micrometers (500 µm) away from an edge of one of the plurality of vias at the first surface of the substrate.

31. The system of claim 23, wherein the non-via structure is more than one hundred micrometers (100 µm) and less than two hundred micrometers (200 µm) away from an edge of one of the plurality of vias at the first surface of the substrate.

32. A method for forming a substrate including both a via and a non-via structure, the method comprising:
laser damaging a substrate using a quasi-non-diffracting beam through a transparent eruption mitigation layer to yield a damage track extending from a first surface of the substrate to a second surface of the substrate at a location where a via is to be formed;
forming a non-via structure on the substrate after the laser damage;
forming a protective coating over at least a portion of the non-via structure and a surface of the substrate;
after forming the protective coating, etching the substrate such that substrate material around the damage track is removed at a higher rate than substrate material at other locations on the substrate, wherein a via is formed at a location corresponding to the damage track; and
conformally coating the inner walls of the via with a conductive material.

33. A method for processing a substrate, the method comprising:
- performing percussive drilling using a Gaussian beam to define a path in relation to a substrate;
- forming a non-via structure on the substrate after defining the path; and
- after forming the non-via structure on the substrate, etching the substrate such that substrate material around the defined path is removed at a higher rate than substrate material at other locations on the substrate, wherein a via is formed at a location corresponding to the defined path.

34. The method of claim 33, the method further comprising:
- forming a protective coating over at least the non-via structure prior to etching the substrate, wherein the protective coating operates to reduce damage to the non-via structure during etching of the substrate.

35. The method of claim 34, wherein forming the protective coating further includes forming the protective coating over at least a portion of the surface of the substrate, and wherein the protective coating further operates to reduce damage to the portion of the surface of the substrate during etching of the substrate.

36. The method of claim 34, wherein the protective coating is chromium oxynitride (CrON).

37. The method of claim 34, the method further comprising:
- removing at least a portion of the protective coating after etching the substrate is completed.

38. The method of claim 1, the method further comprising:
- forming a conductive material in the via.

39. The method of claim 38, wherein forming the conductive material in the via includes conformally coating at least a portion of walls of the via with a metal.

40. The method of claim 33, wherein the non-via structure is a thin film transistor.

41. A method for processing a substrate, the method comprising:
- performing a via pre-definition on a substrate, wherein at least one defined path into the substrate is created;
- forming a non-via structure disposed over a selected surface of the substrate after performing the via pre-definition, wherein a location of the defined path on the selected surface of the substrate is not covered by the non-via structure; and
- after forming the non-via structure on the substrate, etching the substrate from the selected surface, wherein substrate material around the predefined path at the selected surface is removed at a higher rate than substrate material at other locations on the substrate, and wherein a via is formed at a location corresponding to the defined path.

42. The method of claim 41, wherein the substrate is a transparent substrate.

43. The method of claim 41, the method further comprising:
- applying a protective layer over the substrate prior to performing the via pre-definition, wherein the via pre-definition is performed through the protective layer.

44. The method of claim 43, wherein the protective layer comprises a sheet of material at least partially transparent to a defined wavelength of light.

45. The method of claim 43, wherein applying the protective layer over the substrate includes non-adhesively placing the protective layer on the substrate.

46. The method of claim 43, wherein applying the protective layer over the substrate includes adhesively attaching the protective layer to the substrate.

47. The method of claim 43, wherein applying the protective layer over the substrate includes depositing a protective material over at least one surface of the substrate.

48. The method of claim 41, wherein performing the via pre-definition includes percussive drilling using a Gaussian beam.

49. The method of claim 41, the method further comprising:
- forming a protective coating over at least the non-via structure prior to etching the substrate, wherein the protective coating operates to reduce damage to the non-via structure during etching of the substrate.

50. The method of claim 49, wherein forming the protective coating further includes forming the protective coating over at least a portion of the surface of the substrate, and wherein the protective coating further operates to reduce damage to the portion of the surface of the substrate during etching of the substrate.

51. The method of claim 49, wherein the protective coating is chromium oxynitride (CrON).

52. The method of claim 49, the method further comprising:
- removing at least a portion of the protective coating after etching the substrate is completed.

53. The method of claim 41, the method further comprising:
- forming a conductive material in the via.

54. The method of claim 53, wherein forming the conductive material in the via includes conformally coating at least a portion of walls of the via with a metal.

55. The method of claim 41, wherein the non-via structure is a thin film transistor.

* * * * *

UNITED STATES PATENT AND TRADEMARK OFFICE
CERTIFICATE OF CORRECTION

PATENT NO. : 10,424,606 B1
APPLICATION NO. : 15/972628
DATED : September 24, 2019
INVENTOR(S) : Sean Matthew Garner et al.

Page 1 of 1

It is certified that error appears in the above-identified patent and that said Letters Patent is hereby corrected as shown below:

On the Title Page

On page 2, in Column 1, item (56), Other Publications, Line 2, delete "Phoshide" and insert -- Phosphide --, therefor.

Signed and Sealed this
Third Day of March, 2020

Andrei Iancu
*Director of the United States Patent and Trademark Office*